(12) United States Patent
Oku et al.

(10) Patent No.: US 6,646,327 B2
(45) Date of Patent: Nov. 11, 2003

(54) SEMICONDUCTOR DEVICE AND SEMICONDUCTOR DEVICE MANUFACTURING METHOD

(75) Inventors: Taizo Oku, Tokyo (JP); Junichi Aoki, Tokyo (JP); Youichi Yamamoto, Tokyo (JP); Takashi Koromokawa, Tokyo (JP)

(73) Assignees: Canon Sales Co., Inc. (JP); Semiconductor Process Laboratory Co., Ltd. (JP)

( * ) Notice: Subject to any disclaimer, the term of this patent is extended or adjusted under 35 U.S.C. 154(b) by 0 days.

(21) Appl. No.: 10/126,666

(22) Filed: Apr. 22, 2002

(65) Prior Publication Data
US 2002/0127869 A1 Sep. 12, 2002

Related U.S. Application Data

(62) Division of application No. 09/904,868, filed on Jul. 16, 2001, now Pat. No. 6,420,276.

(51) Int. Cl.[7] ................................................ H01L 23/58
(52) U.S. Cl. ........................................ 257/632; 257/437
(58) Field of Search ........................... 257/9, 183, 200, 257/201, 437, 442, 613, 614, 615, 632, 758, 759, 760

(56) References Cited

U.S. PATENT DOCUMENTS 5,461,010 A  * 10/1995 Chen et al. ................. 438/699
6,214,748 B1 *  4/2001 Kobayashi et al. .......... 438/782
6,420,276 B2 *  7/2002 Oku et al. ................... 438/758
6,500,752 B2 * 12/2002 Oku et al. ................... 438/622

FOREIGN PATENT DOCUMENTS

| EP | 0 881 678 A2 | 5/1998 |
| JP | 11-288931 A | 2/1999 |
| WO | 98/50945 | 5/1997 |

* cited by examiner

Primary Examiner—David Nhu
(74) Attorney, Agent, or Firm—Lorusso, Loud & Kelly

(57) ABSTRACT

The present invention relates to a semiconductor device manufacturing method for forming an interlayer insulating film containing a coating insulating film having a low dielectric constant. In construction, there are provided the steps of preparing a substrate 20 on a surface of which a coating insulating film 26 is formed by coating a coating liquid containing any one selected from a group consisting of silicon-containing inorganic compound and silicon-containing organic compound, and forming a protection layer 27 for covering the coating insulating film 26 by plasmanizing a first film forming gas to react, wherein the first film forming gas consists of any one selected from a group consisting of alkoxy compound having Si—H bonds and siloxane having Si—H bonds and any one oxygen-containing gas selected from a group consisting of $O_2$, $N_2O$, $NO_2$, CO, $CO_2$, and $H_2O$.

4 Claims, 17 Drawing Sheets

FIG. 3A

Film Density Measured by the X-Ray Interference Method

| Examined Film Type | PE-CVD TMS SiO$_2$ Film | PE-CVD TEOS SiO$_2$ Film | PE-CVD SiH$_4$ SiO$_2$ Film | Thermal SiO$_2$ Film |
|---|---|---|---|---|
| Film Density (g/cm$^3$) | 2.33 | 2.26 | 2.24~2.30 | 2.23 |

FIG. 3B

Film Density Measured by the Weight Measurement

| Examined Film Type | PE-CVD TMS SiO$_2$ Film | PE-CVD TEOS SiO$_2$ Film | PE-CVD SiH$_4$ SiO$_2$ Film |
|---|---|---|---|
| Film Density (g/cm$^3$) | 2.33 | 2.1~2.2 | 2.20 |

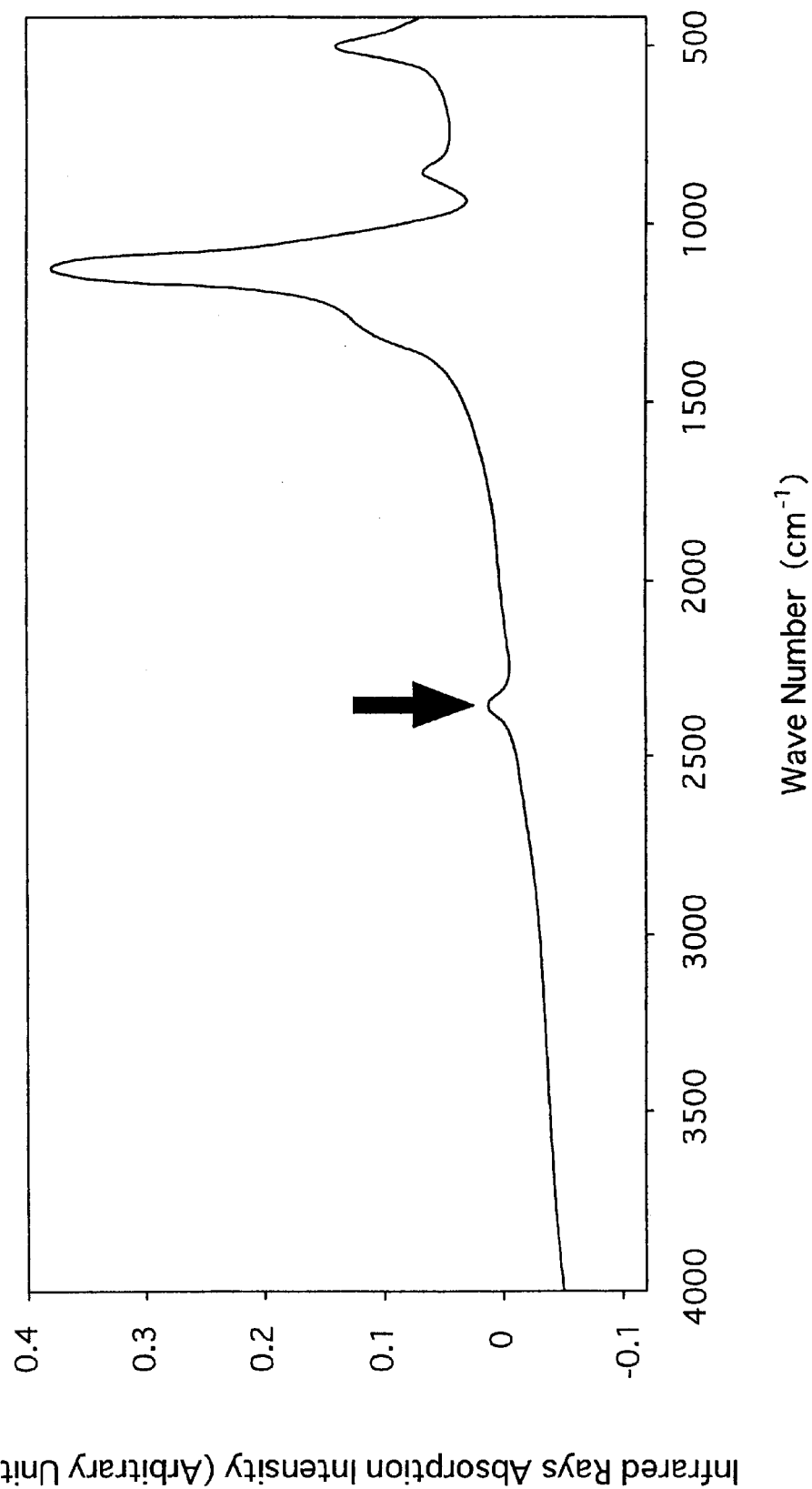

FIG. 8

| Underlying Low Dielectric Constant Insulating Film Type | | Examined Film Type | |
|---|---|---|---|
| | Surface Treatment | PE-CVD TMS SiO$_2$ Film | PE-CVD TEOS SiO$_2$ Film |
| Inorganic Coating Insulating Film k=2.9 | Applied | ○ | △ |
| | Not Applied | ○ | × |
| Organic Coating Insulating Film k=2.8 | Applied | ○ | △ |
| | Not Applied | ○ | × |

SEMICONDUCTOR DEVICE AND SEMICONDUCTOR DEVICE MANUFACTURING METHOD

CROSS-REFERENCE TO RELATED APPLICATIONS

The present application is a division of U.S. Ser. No. 09/904,868 filed Jul. 16, 2001 now U.S. Pat. No. 6,420,276 and claims priority of Japanese Application No. 2000-221380 filed Jul. 21, 2000 and Japanese Application No. 2000-281263 filed Sep. 18, 2000.

BACKGROUND OF THE INVENTION

1. Field of the Invention

The present invention relates to a semiconductor device and a semiconductor device manufacturing method and, more particularly, a semiconductor device and a semiconductor device manufacturing method for forming an interlayer insulating film containing a coating insulating film having a low dielectric constant.

2. Description of the Prior Art

In recent years, the multi-layered wiring structure using the interlayer insulating film having the low dielectric constant is employed with the higher integration degree and the higher density of the semiconductor integrated circuit devices. In such case, the coating insulating film that is excellent in flatness and has the low relative dielectric constant is often employed as the interlayer insulating film.

The coating insulating film having the low relative dielectric constant can be obtained by coating the coating liquid containing the silicon-containing inorganic compound or the coating liquid containing the silicon-containing organic compound on the film forming surface by the spin coating method and then removing the solvent in the coating liquid by the heating.

However, the coating insulating film contains a large amount of moisture in the film and has the high hygroscopicity. Also, the strength of the coating insulating film itself is relatively low. Since the coating insulating film has a poor adhesiveness with a CVD (Chemical Vapor Deposition) film or a metal wiring layer, there is a fear of resulting in peeling-off of the film.

In order to compensate the weak point of the coating insulating film, such a structure is often employed that a cap layer (upper protection layer) and a liner layer (lower protection layer) containing Si and N or Si and C are formed on and under the coating insulating film to wrap the coating insulating film therein.

The semiconductor device having a multi-layered wiring comprises an interlayer insulating film that is formed between the upper and lower wirings by laminating in order the lower protection layer containing Si and N or Si and C, the coating insulating film and the upper protection layer containing Si and N or Si and C.

However, since the insulating film containing Si and N has a high relative dielectric constant, the entire interlayer insulating film results in having a higher dielectric constant even if employing the lower and upper protection layers of thinner thickness.

It is difficult for the lower and upper protection layers containing Si and C to sufficiently suppress an increase of a leakage current while the lower and upper protection layers containing Si and C have lower relative dielectric constants than the lower and upper protection layers containing Si and N.

In addition, it is impossible to say that the adhesiveness between the coating insulating film and the lower and upper protection layers containing Si and N or Si and C is good, and thus the barrier characteristic to the moisture, etc. is not perfect.

On the other hand, there is an occasion where the other lower and upper protection layers are formed on the lower and upper surfaces of the coating insulating film using a plasma enhanced chemical vapor deposition method (hereinafter, referred to as PE-CVD method). PE-CVD method is capable of film-forming at a relatively lower range of temperature while using a gas containing $SiH_4$ and $N_2O$, a gas containing $SiH_4$ and $O_2$, or a gas containing TEOS and $O_2$ as a film-forming gas in order to improve the adhesiveness.

However, in the other lower and upper protection layers, there are problems as follows for the reasons why the adhesiveness to the coating insulating film and a mechanical strength of the film itself is not sufficient, and a gas having a strong oxidizing reaction is employed.

(i) There arises the peeling-off of the coating insulating film at an interface between the coating insulating film and the lower or upper protection layer.

(ii) The laminated structure in the semiconductor device is destroyed through the destroy of the lower protection layer as a stopper which serves as a framework (for reinforcement) during processing, especially CMP (Chemical mechanical Polishing).

(iii) At a formation of the upper protection layer, the usage of the film-forming gas including the gas having the strong oxidizing reaction results in an increase of the dielectric constant due to an oxidization of the coating insulating film.

SUMMARY OF THE INVENTION

It is an object of the present invention to provide a semiconductor device and a semiconductor device manufacturing method, in a cover insulating film constituted by a coating insulating film and a protection layer for covering an upper surface or a lower surface of the coating insulating film, or in an interlayer insulating film constituted by a coating insulating film and a protection layer for covering an upper surface and a lower surface of the coating insulating film, capable of forming the cover insulating film or the interlayer insulating film that can achieve a lower dielectric constant as a whole, has a more complete barrier characteristic to the moisture, or the leakage current, etc., and is excellent in flatness.

It is another object of the present invention to provide a semiconductor device and a semiconductor device manufacturing method capable of improving an adhesiveness between the protection layer and the coating insulating film and a mechanical strength of the protection layer itself.

Advantages that are achieved by a configuration of the present invention will be explained as follows.

In the present invention, a protection layer is formed to cover a coating insulating film by plasmanizing a first film forming gas to react, wherein the first film forming gas consists of any one selected from a group consisting of alkoxy compound having Si—H bonds and siloxane having Si—H bonds and any one oxygen-containing gas selected from a group consisting of $O_2$, $N_2O$, $NO_2$, CO, $CO_2$, and $H_2O$.

According to the experiment made by the inventors of the present invention, it is found that the silicon-containing insulating film formed by plasmanizing the first film forming gas to react has a good adhesiveness to the coating insulating film, is dense to the same extent as the silicon nitride film, is excellent in the water resistance, and contains the small content of moisture in the film.

In this manner, the plasma CVD insulating film according to the present invention has the good adhesiveness to the coating insulating film and also has the density equivalent to the silicon nitride film. Therefore, when the plasma CVD insulating film according to the present invention is formed to come into contact with the coating insulating film and to cover the coating insulating film like the configuration of the present invention, there can be obtained the cover insulating film that can have the more complete barrier characteristic to the entering of the moisture into the coating insulating film from the outside and to the flowing-out of the moisture to the outside, while being excellent in flatness.

Also, the plasma CVD insulating film according to the present invention has the lower relative dielectric constant than the silicon nitride film in addition to the above characteristics. The protection layer made of the plasma CVD insulating film according to the present invention are formed on at least any one of an upper surface and a lower surface of the coating insulating film which serves as the main cover insulating film or the main interlayer insulating film and has the low relative dielectric constant. There can be obtained the cover insulating film or interlayer insulating film that has more completely the barrier characteristic to the entering/flowing-out of the moisture into/from the coating insulating film, the barrier characteristic to the leakage current, etc. and also achieves the low dielectric constant as a whole.

In this manner, according to the present invention, there can be obtained the cover insulating film or interlayer insulating film that can achieve the lower dielectric constant as a whole, has a barrier characteristic to the entering/flowing-out of the moisture into/from the coating insulating film and a barrier characteristic to the leakage current, etc. more completely, and is excellent in flatness.

The silicon-containing insulating film of the present invention has a peak of the absorption intensity of the infrared rays in a range of the wave number 2270 to 2350 $cm^{-1}$, a film density in a range of 2.25 to 2.40 $g/cm^3$, and a relative dielectric constant in a range of 3.3 to 4.3.

According to the experiment of the inventors of this application, it is found that the silicon-containing insulating film having such characteristics has the high mechanical strength, is dense, is excellent in the water resistance, and has the small amount of contained moisture in the film like the silicon nitride film, and has the relative dielectric constant smaller than the silicon nitride film. Further, it is found that the silicon-containing insulating film has a good adhesiveness to the coating insulating film.

Therefore, if the silicon-containing insulating film having aforementioned characteristics is employed as the protection layer for covering the wirings, etc., the corrosion of the wiring can be prevented by blocking a penetration of the incoming moisture into the semiconductor device, while the parasitic capacitance between the wirings can be reduced.

Also, the upper and lower wirings and the interlayer insulating film interposed between the upper and lower wirings are provided on the substrate. The interlayer insulating film is constructed by laminating in order from the bottom the lower protection layer formed of the silicon-containing insulating film according to the present invention, the main insulating film, and the upper protection layer formed of the silicon-containing insulating film according to the present invention.

The silicon-containing insulating film having aforementioned characteristics has a good adhesiveness with the coating insulating film, and has the high mechanical strength. Therefore, the laminated structure is prevented from a destroy such as a peeling-off of the films, etc., even if a mechanical shock is applied to the laminated structure from outside.

The silicon-containing insulating film having aforementioned characteristics is dense. Therefore, the moisture contained in the coating insulating film can be prevented from flowing out to the peripheral portions of the silicon-containing insulating film.

BRIEF DESCRIPTION OF THE DRAWINGS

FIG. 3A and FIG. 3B are tables showing examined results of a film density of the insulating film that is formed by the film forming method according to the second embodiment of the present invention using the sample of FIG. 2A;

FIG. 5A is a graph showing examined results of an infrared absorption intensity of the silicon-containing insulating film that is formed by the film forming method according to a second embodiment of the present invention using the sample of FIG. 2A;

FIG. 8 is a table showing examined results of an adhesiveness of the silicon-containing insulating film, that is formed by the film forming method according to the second embodiment of the present invention, to a coated insulating film using the sample of FIG. 2C;

DESCRIPTION OF THE PREFERRED EMBODIMENTS

Embodiments of the present invention will be explained with reference to the accompanying drawings hereinafter.

(First Embodiment)

Figure 1:
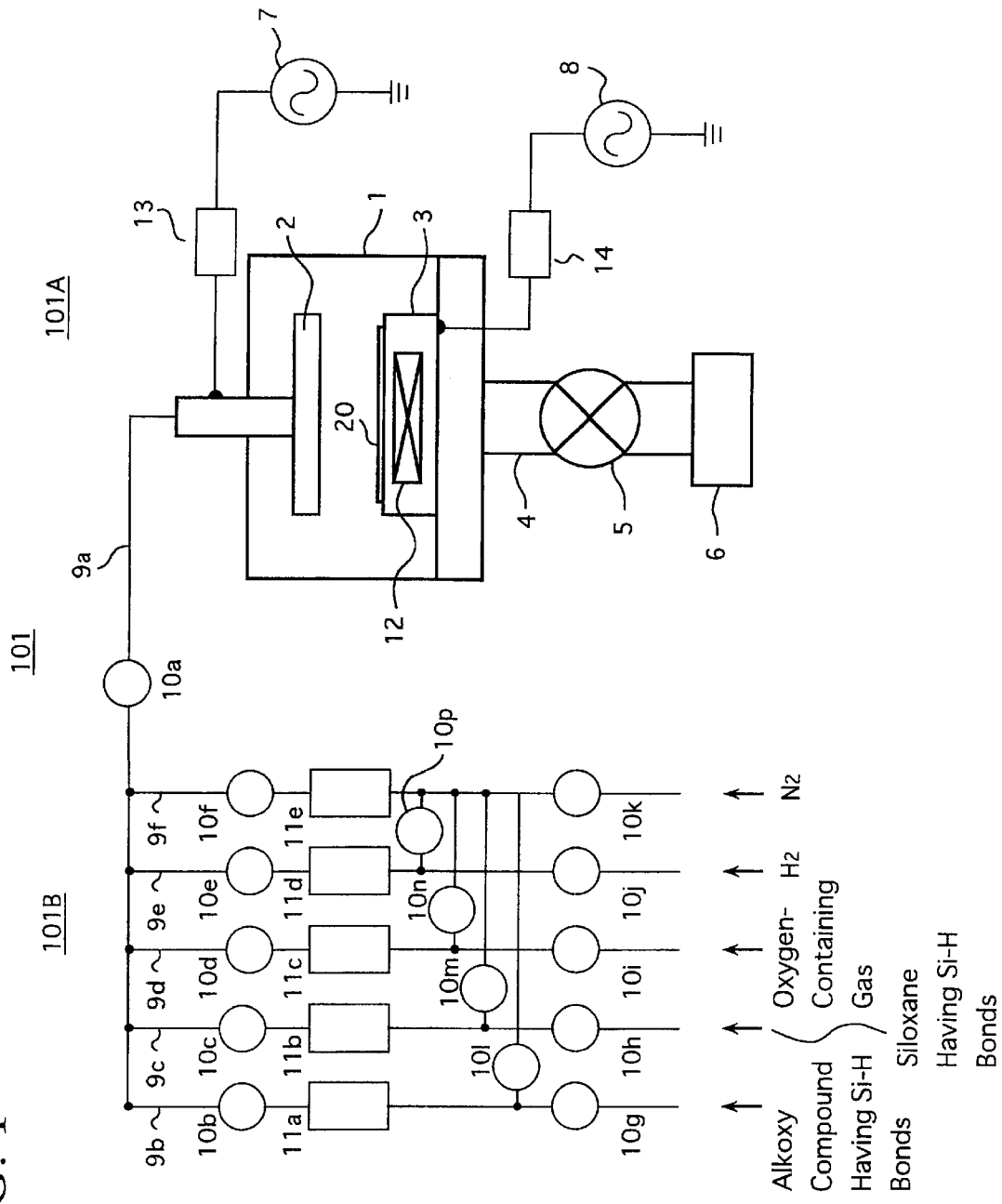
FIG. 1 is a side view showing a configuration of the plasma CVD film forming apparatus employed in a film forming method according to a first embodiment of the present invention.

FIG. 1 is a side view showing a configuration of the parallel-plate type plasma CVD film forming apparatus 101 employed in a film forming method according to an embodiment of the present invention.

This plasma CVD film forming apparatus 101 comprises a film forming portion 101A that is the place at which a silicon-containing insulating film is formed by the plasma gas on a substrate 20, and a film forming gas supplying portion 101B having a plurality of gas supply sources constituting film forming gases.

As shown in FIG. 1, the film forming portion 101A has a chamber 1 whose pressure can be reduced, and the chamber 1 is connected to an exhausting device 6 via an exhaust pipe 4. A switching valve 5 for controlling the open and the close between the chamber 1 and the exhausting device 6 is provided in the middle of the exhaust pipe 4. A pressure measuring means such as a vacuum gauge (not shown) for monitoring the pressure in the chamber 1 is provided to the chamber 1.

A pair of an upper electrode (a first electrode) 2 and a lower electrode (a second electrode) 3 opposing each other are provided to the chamber 1. A high frequency power supply (RF power supply) 7 for supplying a high frequency power having a frequency of 13.56 MHz is connected to the upper electrode 2, while a low frequency power supply 8 for supplying a low frequency power having a frequency of 380 kHz is connected to the lower electrode 3. The film forming gas is plasmanized by supplying the power to the upper electrode 2 and the lower electrode 3 from these power supplies 7, 8. The upper electrode 2, the lower electrode 3, and the power supplies 7, 8 constitute the plasma generating means for plasmanizing the film forming gas.

As the plasma generating means, there are the means for generating the plasma by the first and second electrodes 2, 3 of the parallel-plate type, the means for generating the plasma by ECR (Electron Cyclotron Resonance) method, the means for generating the helicon plasma by irradiating the high frequency power from the antenna, etc., for example.

The upper electrode 2 is also used as a film forming gas distributor. A plurality of through holes are formed in the upper electrode 2, and opening portions of the through holes in the surface opposing to the lower electrode 3 serve as discharge ports (inlet ports) of the film forming gas. The discharge ports of the film forming gas, etc. are connected to the film forming gas supplying portion 101B via a pipe 9a. Also, a heater (not shown) may be provided to the upper electrode 2, as the case may be. This is because, if the upper electrode 2 is heated at the temperature of almost 100° C. during the film formation, particles made of reaction products of the film forming gas, etc. can be prevented from sticking onto the upper electrode 2.

The lower electrode 3 is also used as a loading table for the substrate 20. A heater 12 for heating the substrate 20 on the loading table is provided to the lower electrode 3.

In the film forming gas supplying portion 101B, a supply source for the alkoxy compound having Si—H bonds; a supply source for the siloxane having Si—H bonds; a supply source for any one oxygen-containing gas selected from a group consisting of oxygen ($O_2$), nitrogen monoxide ($N_2O$), nitrogen dioxide ($NO_2$), carbon monoxide (CO), carbon dioxide ($CO_2$), and water ($H_2O$); a supply source for the hydrogen ($H_2$); and a supply source for the nitrogen ($N_2$) are provided.

As for the alkoxy compound having Si—H bonds or the siloxane having Si—H bonds as the film forming gas to which the present invention is applied, followings may be employed as the typical examples.

(i) alkoxy compound having Si—H bonds trimethoxysilane (TMS: $SiH(OCH_3)_3$)

(ii) siloxane having Si—H bonds tetramethyldisiloxane (TMDSO: $(CH_3)_2HSi—O—SiH(CH_3)_2$)

These gases are supplied appropriately to the chamber 1 of the film forming portion 101A via branch pipes 9b to 9f and a pipe 9a to which all branch pipes 9b to 9f are connected. Flow rate controlling means 11a to 11e and switching means 10b to 10k for controlling the open and the close of the branch pipes 9b to 9f are provided in the middle of the branch pipes 9b to 9f. A switching means 10a for controlling the open and the close of the pipe 9a is provided in the middle of the pipe 9a. Also, in order to purge the residual gas in the branch pipes 9b to 9e by flowing the $N_2$ gas, switching means 101 to 10n, 10p for controlling the open and the close between the branch pipe 9f, that is connected to the $N_2$ gas supply source, and remaining branch pipes 9b to 9e are provided. The $N_2$ gas purges the residual gas in the pipe 9a and the chamber 1 in addition to the branch pipes 9b to 9e.

According to the film forming apparatus 101 described above, the supply source for supplying at least any one of the alkoxy compound having Si—H bonds and the siloxane having Si—H bonds and the oxygen-containing gas supply source are provided, and also the plasma generating means 2, 3, 7, 8 for plasmanizing the film forming gas are provided.

The insulating film containing Si, O, C, H can be formed by the plasma CVD method by using the above plasma CVD equipment. Therefore, as shown in a second embodiment described in the following, it is possible to form the insulating film that has the low dielectric constant, has the small amount of moisture content, is dense and is excellent in water resistance. Also, this insulating film has the good adhesiveness to the organic coating insulating film or the inorganic coating insulating film, and has the higher capability for preventing the diffusion of copper (Cu).

In particular, the power supplies 7, 8 for supplying the powers having two high and low frequencies to the first and second electrodes 2, 3 of parallel-plate type respectively are connected to them. Therefore, the plasma can be generated by applying the powers having these two high and low frequencies to the electrodes 2, 3 respectively. Thus, the insulating film formed in this manner is dense.

(Second Embodiment)

The examination made by the inventors of the present invention for the silicon-containing insulating film that is formed by the above plasma CVD equipment will be explained hereunder.

First, the well-known parallel-plate type plasma CVD equipment is employed as the above plasma CVD equipment. The lower electrode 3 of the upper and lower electrodes 2, 3 is also used as a substrate holder, and the heater 12 for heating the substrate is built in the lower electrode 3.

(Formation of Samples)

FIGS. 2A to 2E are sectional views showing samples having a silicon oxide film (a silicon-containing insulating film) of the present invention.

Figure 2A:
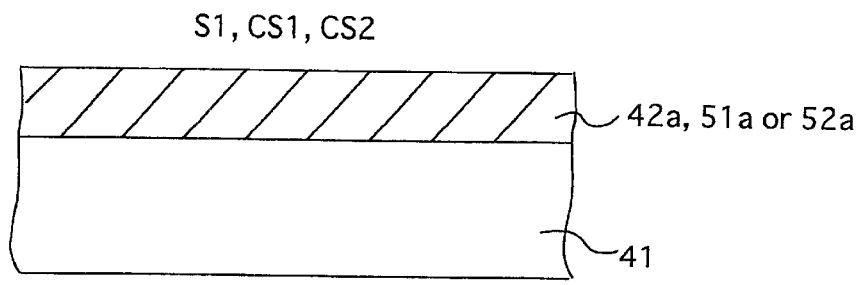
FIG. 2A to FIG. 2E are sectional views showing structures of samples employed to examine characteristics of a silicon-containing insulating film that is formed by the film forming method according to the first embodiment of the present invention, and structures of comparative samples.

As shown in FIG. 2A, a sample S1 has the silicon oxide film (this means the silicon-containing insulating film, and referred to as a "PE-CVD TMS $SiO_2$ film" hereinafter) 42a, that is formed by the PE-CVD method using the film forming gas containing trimethoxysilane (TMS) on a silicon substrate 41. For the sake of comparison, a comparative sample CS1 having a silicon oxide film (referred to as a "PE-CVD TEOS $SiO_2$ film" hereinafter) 51a, that is formed by the PE-CVD method using the film forming gas containing tetraethoxysilane (TEOS) on the silicon substrate 41, and a comparative sample CS2 having a silicon oxide film (referred to as a "PE-CVD $SiH_4$ $SiO_2$ film" hereinafter) 52a, that is formed by the PE-CVD method using the film forming gas containing monosilane ($SiH_4$) on the silicon substrate 41, are prepared.

Figure 2B:
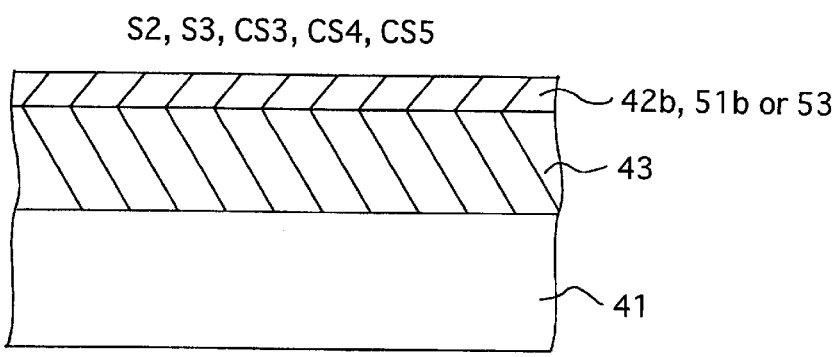
Figure 2C:
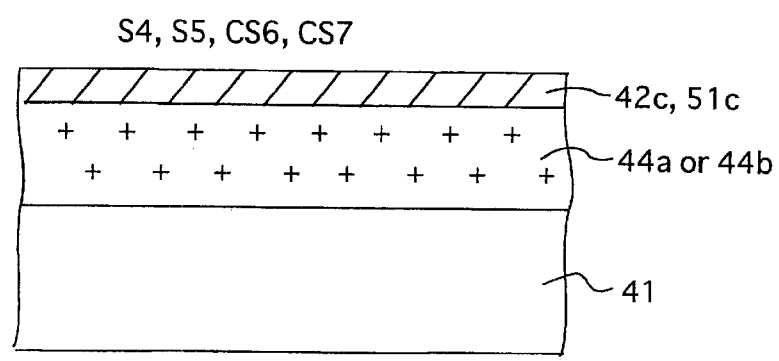
Figure 2D:
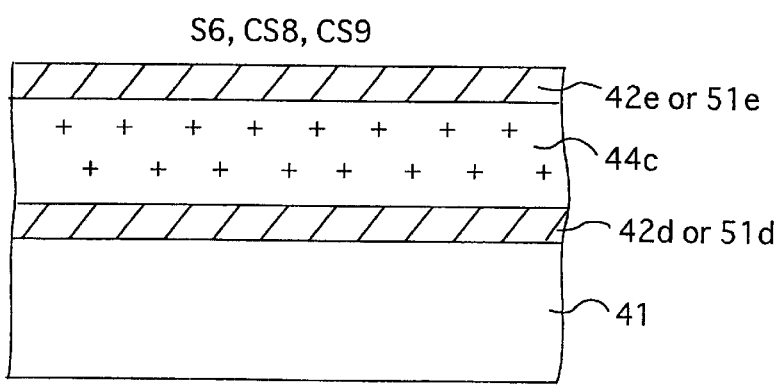
Figure 2E:
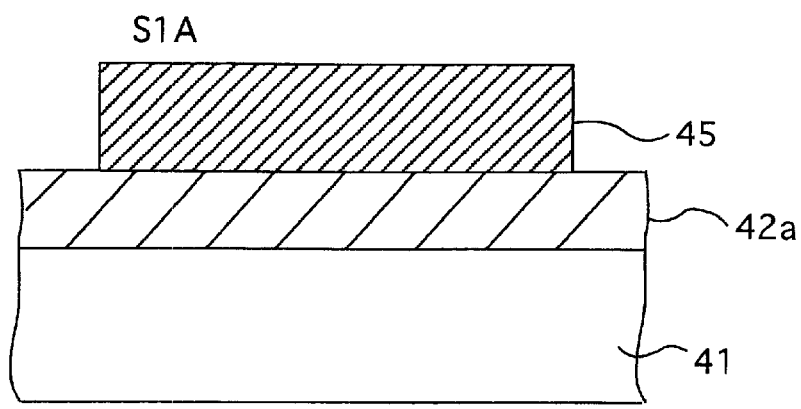

As shown in FIG. 2E, a sample S1A is formed by further forming an electrode 45 on the PE-CVD TMS $SiO_2$ film 42a, in the sample S1 in which the PE-CVD TMS $SiO_2$ film 42a is formed on the silicon substrate 41. The mercury probe is employed as the electrode 45, and a contact area between the mercury probe and the PE-CVD TMS $SiO_2$ film 42a is 0.0230 $cm^2$.

As shown in FIG. 2B, samples S2, S3 are formed by forming a BPSG film 43 having an amount of contained phosphorus of 7 mol % and a film thickness of about 500 nm and a PE-CVD TMS $SiO_2$ film 42b to be tested in sequence on the silicon substrate (Si substrate) 41. A film thickness of the PE-CVD TMS $SiO_2$ film 42b is set to 100 nm in the sample S2, and a film thickness of the PE-CVD TMS $SiO_2$ film 42b is set to 200 nm in the sample S3. For comparison, a comparative sample CS3 employing a PE-CVD TEOS $SiO_2$ film 51b having a film thickness of 200 nm in place of the PE-CVD TMS $SiO_2$ film 42b, a comparative sample CS4 employing a PE-CVD $SiH_4$ $SiO_2$ film 52b having a film thickness of 200 nm similarly, and a comparative sample CS5 employing a silicon nitride film (referred to as a "PE-CVD SiN film" hereinafter) 53, that is formed by the plasma CVD method using the film forming gas containing $SiH_4$, $NH_3$ and $N_2$ similarly to have a film thickness of 200 nm, are prepared.

As shown in FIG. 2C, samples S4, S5 are formed by forming low dielectric constant insulating films 44a, 44b and a PE-CVD TMS $SiO_2$ film 42c in sequence on the silicon substrate (Si substrate) 41. An inorganic coating insulating film 44a is employed as the low dielectric constant insulating film in the sample S4, and an organic coating insulating film 44b is employed similarly in the sample S5. For comparison, comparative samples CS6, CS7 employing a PE-CVD TEOS $SiO_2$ film 51c in place of the PE-CVD TMS $SiO_2$ film 42c are formed. The inorganic coating insulating film 44a is employed as the low dielectric constant insulating film in the comparative sample CS6, and the organic coating insulating film 44b is employed similarly in the comparative sample CS7.

The inorganic coating insulating film is such an insulating film that is formed by coating the coating liquid such as HSQ (product name: manufactured by Dow Corning Co., Ltd.), MSQ (product name), R7 (product name: Hitachi Chemical Co., Ltd.), etc. The compound having one carbon or less is distinctively contained as the component compound in the coating liquid. The organic coating insulating film is formed by coating the coating liquid such as FLARE (product name: manufactured by Allied Signal Co., Ltd.), SiLK (product name: manufactured by The Dow Chemical Co.), etc. The compound having two carbons or more is distinctively contained as the component compound in the coating liquid.

As shown in FIG. 2D, a sample S6 is formed by forming a PE-CVD TMS $SiO_2$ film (lower protection layer) 42d having a film thickness of about 150 nm, a coating insulating film (main insulating film) 44c having a film thickness of about 200 nm, and a PE-CVD TMS $SiO_2$ film (upper protection layer) 42e having a film thickness of about 200 nm in sequence on the silicon substrate 41. The coating insulating film 44c is formed by spin-coating the coating liquid (FOx (product name)), that is produced by dissolving HSQ (Hydrogen silsesquioxane) into the solvent, then baking the coated liquid at the temperature of 150, 200, and 350° C. for one minute in the nitrogen respectively, and then curing the resultant at the temperature of 400° C. for 50 minutes in the nitrogen. For comparison, a comparative sample CS8 in which a PE-CVD TEOS $SiO_2$ film 51d is formed in place of the PE-CVD TMS $SiO_2$ film 42d as the lower protection layer and a comparative sample CS9 in which PE-CVD TEOS $SiO_2$ films 51d, 51e are formed in place of the PE-CVD TMS $SiO_2$ films 42d, 42e as the upper and lower protection layers are prepared.

The PE-CVD TMS $SiO_2$ films 42a to 42e of the samples S1 to S6 are formed by using the above plasma CVD equipment under following film forming conditions.

Film forming gas: TMS+$N_2O$

TMS gas flow rate: 100 sccm $N_2O$ gas flow rate: 3000 sccm

Gas pressure: 0.7 Torr

Plasmanizing conditions

Power density applied to the upper electrode 2: 0.3 W/$cm^2$ (frequency 13.56 MHz)

Power density applied to the lower electrode 3: 0.3 W/$cm^2$ (frequency 380 kHz)

In this film-forming apparatus, these power densities correspond to the applied powers 750W to the electrodes, respectively.

Substrate temperature: 300 to 400° C.

Film forming thickness: t nm

The above plasma CVD apparatus 101 is also employed for forming the PE-CVD TEOS $SiO_2$ film 51a of the comparative sample CS1, the PE-CVD $SiH_4$ $SiO_2$ film 52a of the comparative sample CS2, the PE-CVD TEOS $SiO_2$ films 51b to 51e of the comparative samples CS3, CS4, CS6 to CS9, the PE-CVD SiN film 53 of the comparative sample CS5.

Following characteristics of the PE-CVD TMS $SiO_2$ film 42a to 42e formed as above are examined.

(i) Basic characteristic

The film forming rate of the above film forming conditions is at the range of about 160 to 170 nm/min.

Also, the refractive index of the formed PE-CVD TMS $SiO_2$ film is at the range of 1.477 to 1.48, and the film stress is −250 Mpa or $3.0 \times 10^9$ dyne/$cm^2$. The ellipsometer using the He—Ne laser having a wavelength of 6338 angstrom is employed to measure the refractive index. Also, the opti-lever laser scanning system is employed to measure the film stress.

Also, the film thickness (t) is 500 nm, and the relative dielectric constant of the PE-CVD TMS $SiO_2$ film is 3.9. The sample C1A is employed as a sample to examine the relative dielectric constant.

The relative dielectric constant is calculated based on the result that is obtained by superposing a small signal having a frequency of 1 MHz onto the DC voltage (V) applied between the Si substrate 41 and the electrode 45 in the examined sample S1A, and then measuring the change in a capacitance (C) in response to the change in the DC voltage (V).

(ii) Concentration of Carbon and Nitrogen in the film

A concentration of carbon and nitrogen in the PE-CVD TMS $SiO_2$ film 42a is measured by the auger electron spectroscopy method (AES method) using the sample S1.

According to the measuring results, the concentration of carbon is 1.0 atoms %, and the concentration of carbon is 2.1 atoms %.

(iii) Film density

The film density of the PE-CVD TMS $SiO_2$ film 42a is examined employing the sample S1 by the well-known X-ray interference method or weight measuring method.

By way of comparison, similar examinations are carried out to the thermal $SiO_2$ film, the comparative sample CS1 of the PE-CVD TEOS $SiO_2$ film 51a, and the comparative sample CS2 of the PE-CVD $SiH_4$ $SiO_2$ film 52a in place of the PE-CVD TMS $SiO_2$ film 42a.

As shown in FIGS. 3A and 3B, it is found that the PE-CVD TMS $SiO_2$ film 42a has the high film density of 2.33 rather than other insulating films and is dense.

(iv) Moisture content in the film

An amount of contained moisture in both the film that is obtained immediately after the formation (as deposited) and the film that is left for two weeks in the air is measured employing the sample S1 by the TDS (Thermal Desorption Mass Spectroscopy) method. This TDS method is the way of heating the sample and then measuring the molecules emitted from the sample. For the sake of comparison, the similar examination is carried out to the comparative sample CS1 employing the PE-CVD TEOS $SiO_2$ film 51a.

The examination is carried out by heating the sample from the room temperature to 800° C. by the TDS analysis equipment and then quantitating the amount of moisture extracted from the sample.

Figure 4:
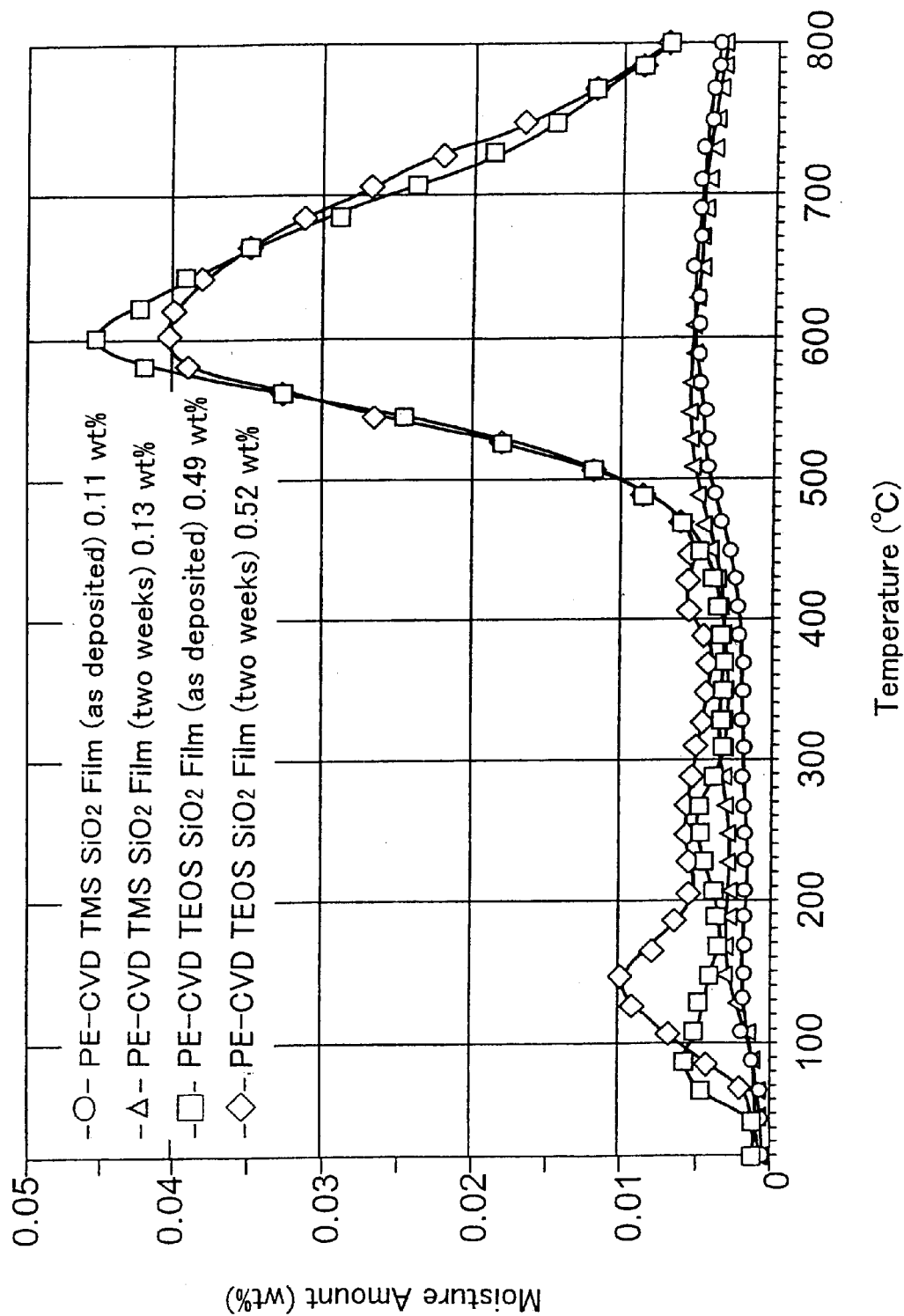
FIG. 4 is a graph showing examined results of a moisture content and a water resistance of the silicon-containing insulating film that is formed by the film forming method according to a second embodiment of the present invention using the sample of FIG. 2A.

FIG. 4 is a graph showing the examined results. In FIG. 4, an ordinate denotes the amount of moisture (wt %) represented in a linear scale and an abscissa denotes the temperature (° C.) represented in a linear scale.

According to the measurement executed immediately after the film formation (as deposited), when the temperature is risen from the room temperature to 800° C., the amount of moisture in the PE-CVD TMS $SiO_2$ film 42a is 0.11 wt % whereas the amount of moisture in the PE-CVD TEOS $SiO_2$ film 51a is 0.49 wt %. In addition, according to the measurement executed two weeks later, the amount of moisture in the PE-CVD TMS $SiO_2$ film 42a is increased merely by +0.2 to 0.3 wt % and thus the amount of moisture is seldom varied.

As described above, it is found that both the structural water (the moisture contained in the film due to the film forming gas and the film structure immediately after the film formation) and the physical adsorption water (the incoming moisture that is adsorbed and absorbed physically) in the PE-CVD TMS $SiO_2$ film 42a are small in contrast to the PE-CVD TEOS $SiO_2$ film 51a.

(v) FT-IR Absorption Intensity

Figure 5B:
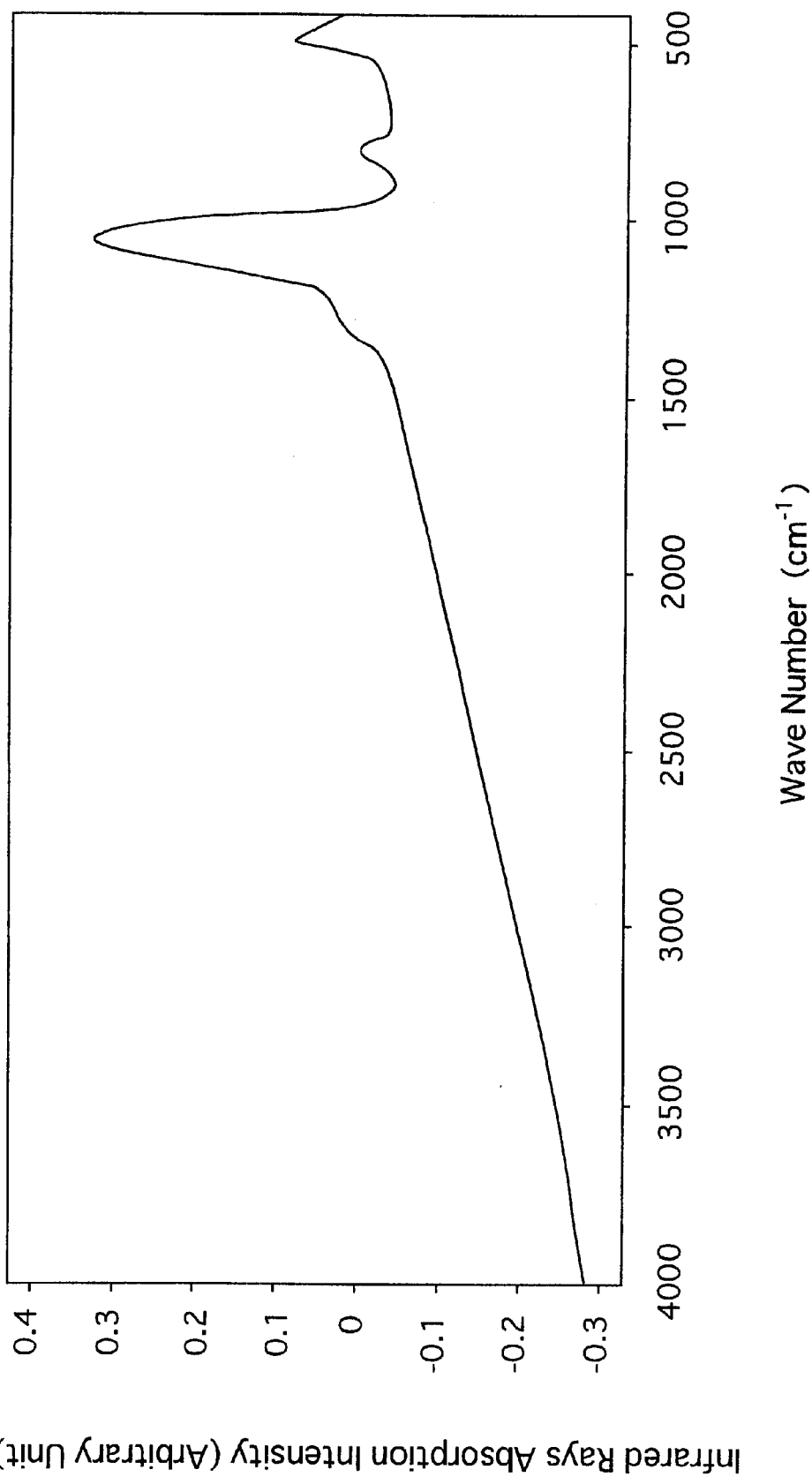
FIG. 5B is a graph showing examined results of an infrared absorption intensity of the silicon-containing insulating film using the comparative sample of FIG. 2A.

Then, examined results of the infrared rays absorption intensity in the sample S1 by the FT-IR analysis method (Fourier Transform Infrared analysis method) are shown in FIG. 5A. Similarly, examined results in the comparative samples CS1, CS2 are shown in FIG. 5B.

An ordinate of FIG. 5A denotes the absorption intensity expressed in a linear scale (arbitrary unit), and an abscissa denotes the wave number expressed in a linear scale ($cm^{-1}$). Similarly, this is true of FIG. 5B.

As shown in FIG. 5A, the peak of the infrared rays absorption intensity having a center wave number in a range of 2270 to 2350 $cm^{-1}$ is confirmed. In contrast, as shown in FIG. 5B, such peak is not watched in the comparative samples CS1, CS2.

(vi) Water Resistance

The water resistance of the PE-CVD TMS $SiO_2$ film 42b is exampled by the high pressure humidifying test (pressure-cooker test) while using the samples S2, S3 shown in FIG. 2B. By way of comparison, the similar examination is applied to the comparative sample CS3 employing the PE-CVD TEOS $SiO_2$ film 51b in place of the PE-CVD TMS $SiO_2$ film 42b and the comparative sample CS5 employing the PE-CVD SiN film 53 similarly.

The conditions of the high pressure humidifying test are given as follows. The leaving time is used as a parameter.

Temperature: 121° C.
Pressure: 2.0 atm
Humidity: 100% R.T. (Room Temperature)

Evaluation of the water resistance is carried out by evaluating an amount of P=O bonds contained in the examined insulating film after the high pressure humidifying test. In order to evaluate the amount of P=O bonds contained in the BPSG film 43, the P=O absorption coefficient is measured by the FT-IR analysis method. If the moisture enters the BPSG film 43, the P=O bonds in the film react with the moisture to destroy. In this case, if the PE-CVD TMS $SiO_2$ film 42b for covering the BPSG film 43 has the high water resistance, the moisture does not pass through such film and thus the P=O bonds in the BPSG film 43 are never destroyed. As a result, it is possible to say that, if the time dependent change of the P=O absorption coefficient becomes smaller, the water resistance becomes higher.

Figure 6:
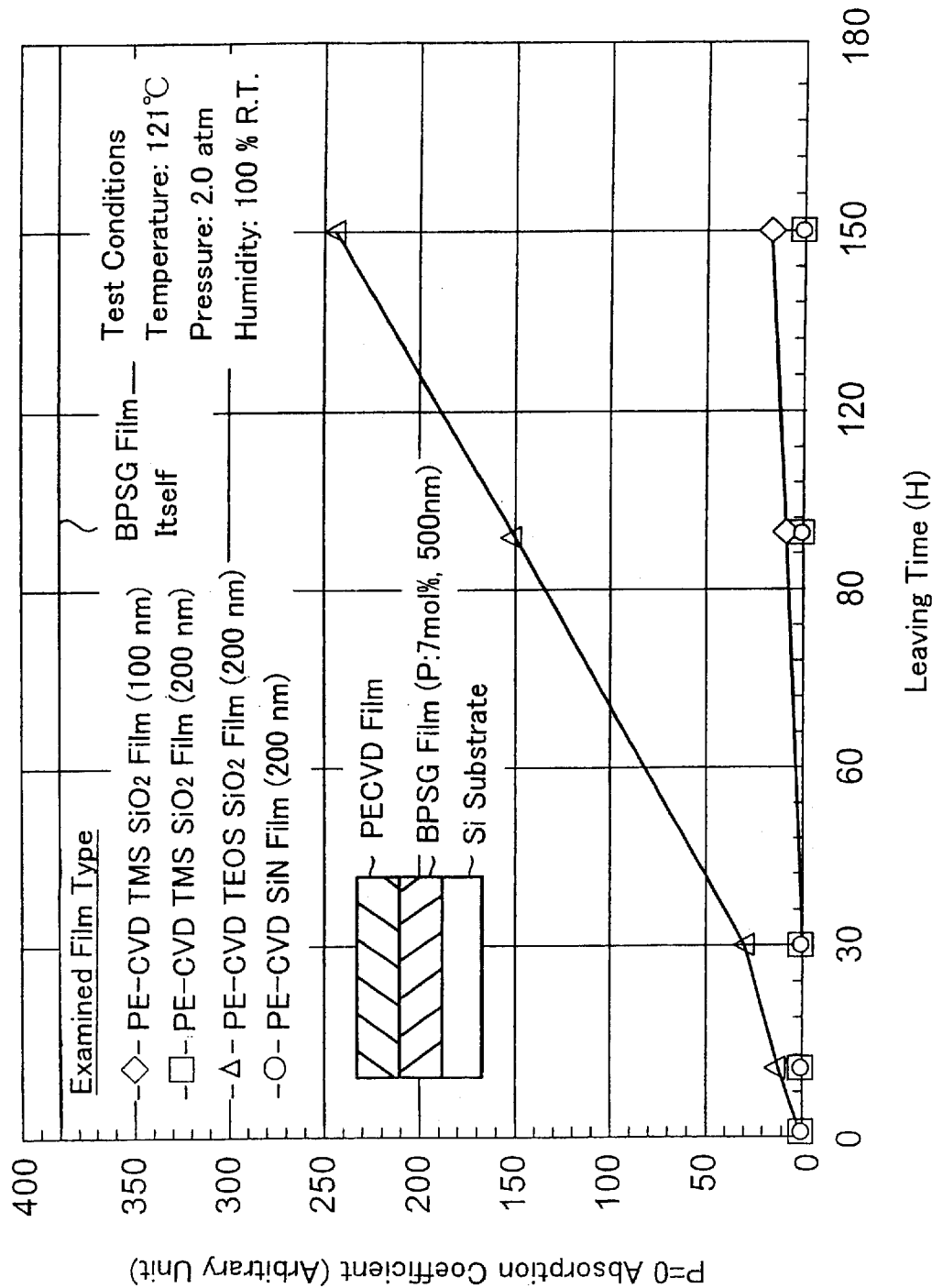
FIG. 6 is a graph showing examined results of a water resistance of the silicon-containing insulating film that is formed by the film forming method according to a second embodiment of the present invention using the sample of FIG. 2B.

FIG. 6 is a graph showing the time dependent change of an amount of contained phosphorus in the insulating film after the high pressure humidifying test is carried out. An ordinate denotes the P=O absorption coefficient (arbitrary unit) expressed in a linear scale, and an abscissa denotes the leaving time (H (hour)) expressed in a linear scale.

Based on the results shown in FIG. 6, it is found that, even after both the samples S2, S3 are left for 150 hours as they are, their P=O absorption coefficients are seldom changed from the initial P=O absorption coefficient regardless of the magnitude of the thickness of the PE-CVD TMS $SiO_2$ film 42b, like the PE-CVD SiN film 53 in the comparative sample CS5, i.e., the PE-CVD TMS $SiO_2$ film 42b has the water resistance equivalent to the PE-CVD SiN film 53.

Also, the water resistance is examined by another high pressure humidifying test while using the examined sample S3 and the comparative samples CS3, CS4.

The conditions of the high pressure humidifying test are the same as above.

Figure 7:
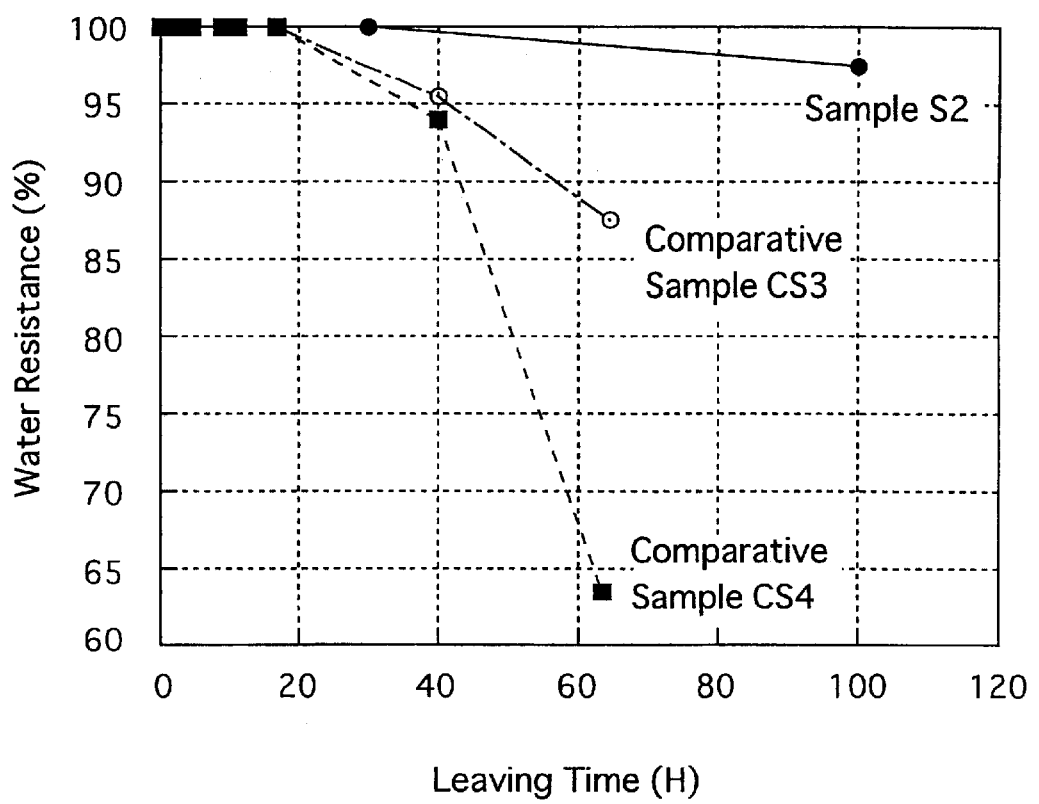
FIG. 7 is a graph showing examined results of a water resistance due to a pressure-cooker test of the silicon-containing insulating film that is formed by the film forming method according to a second embodiment of the present invention using the sample of FIG. 2B.

The results are shown in FIG. 7. An ordinate of FIG. 7 denotes the water resistance (%) expressed in a linear scale, and an abscissa denotes the leaving time (H (hour)) expressed in a linear scale. The sample S3 and the comparative samples CS3, CS4 are used as a parameter.

Like the above, the evaluation of the water resistance is carried out by evaluating an amount of P=O bonds contained in the examined insulating film after the high pressure humidifying test. The water resistance in FIG. 7 is derived by calculating the P=O absorption coefficient obtained after the high pressure humidifying test on the basis of the P=O absorption coefficient before the leaving-off, that is assumed as 100.

As shown in FIG. 7, it is found that the sample S3 has the water resistance of 97.4% (100 H), that exceeds the comparative samples CS3, CS4.

(vii) Leakage current of the film

The examined sample S1A shown in FIG. 2E is formed. That is, the electrode 45 is formed on the PE-CVD TMS $SiO_2$ film 42 having a film thickness (t) of 200 nm in the sample S1 according to the present invention.

The leakage current flowing through the silicon substrate 41 and the electrode 45 is measured by applying the voltage between the silicon substrate 41 and the electrode 45. The silicon substrate 41 is grounded, and the negative voltage is applied to the electrode 45.

According to the results, the leakage current of the PE-CVD TMS $SiO_2$ film 42a as the single substance is on the order of $10^{-8}$ A/cm$^2$ at the electric field strength of 5 MV/cm, and the breakdown voltage is about 10 MV/cm in terms of the electric field.

(viii) Adhesiveness of the film

The adhesiveness between the PE-CVD TMS $SiO_2$ film 42c according to the present invention and the underlying low dielectric constant insulating film 44a, 44b is examined employing the samples S4, S5. Also, the sample which is subjected to the surface treatment prior to the film formation and the sample which is not subjected to the surface treatment are prepared, and then the similar examination is carried out. The surface treatment executed prior to the film formation is the treatment for reforming the surface of the processed film by employing the plasma of $N_2$, $NH_3$, $H_2$, etc.

By way of comparison, the PE-CVD TEOS $SiO_2$ film 51c is employed in place of the PE-CVD TMS $SiO_2$ film 42c, and similar examinations are carried out employing the inorganic coating insulating film 44a (the comparative sample CS6) and the organic coating insulating film 44b (the comparative sample CS7) as the low dielectric constant insulating film.

As the test for examining the adhesiveness of the film, the peel test by using the tape and the peel test by the CMP (Chemical Mechanical Polishing) on the entire surface of the wafer are carried out.

According to the examined results, regardless of the presence of the surface treatment prior to the film formation, the PE-CVD TMS $SiO_2$ film 42c has the good adhesiveness to the inorganic coating insulating film 44a and the organic coating insulating film 44b. In contrast, a degree of the adhesiveness of the PE-CVD TEOS $SiO_2$ film 51c is inferior to the PE-CVD TMS $SiO_2$ film 42c as a whole. Then, difference in the adhesiveness appeared in response to whether or not the surface treatment is applied prior to the film formation. That is, the sample which is subjected to the surface treatment prior to the film formation had the higher adhesiveness than the sample which is not subjected to the surface treatment.

(ix) Defect Generating Rate due to Heat Cycle

The defect generating rate due to the heat cycle about the sample S6 and the comparative samples CS8, CS9 is examined. Respective samples are sealed in the package. Test conditions of the heat cycle are given as follows. The cycle number is used as a parameter.

High temperature (holding time): 150° C. (20 minutes)
Low temperature (holding time): −55° C. (20 minutes)
Cycle number: 100, 200, 300, 500° C.

Figure 9:
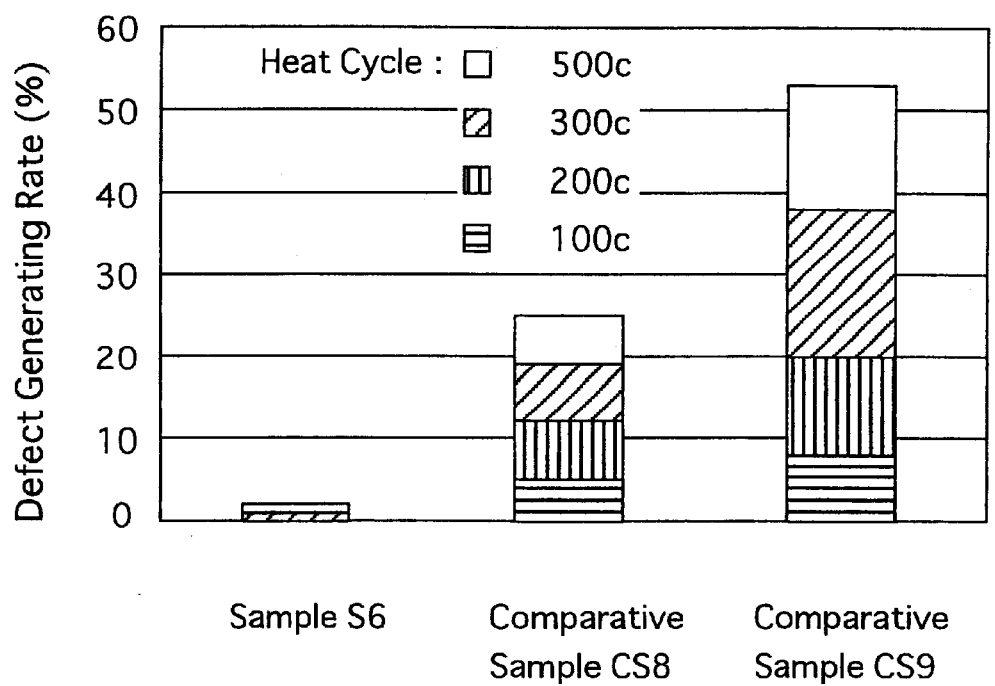
FIG. 9 is a graph showing examined results of a defect generating rate due to a heat cycle using the sample of FIG. 2D according to the second embodiment of the present invention.

The defect is defined as the sample in which a peeling-off of a film or a crack of a film has generated. The results are shown in FIG. 9. An ordinate of FIG. 9 denotes the defect generating rate (%) expressed in a linear scale, and an abscissa denotes the types of the sample. The types of the sample are the sample S6, and the comparative samples CS8, CS9, as explained above, in order from the left side. The partition area indicated by a bar graph denotes a fraction defective at a particular cycle number, the partition area hatched by lateral lines denotes the fraction defective at 100° C., the partition area hatched by vertical lines denotes the fraction defective at 200° C., the partition area hatched by oblique lines denotes the fraction defective at 300° C., and the white partition area on a black ground denotes the fraction defective at 500° C.

As shown in FIG. 9, in the sample S6 employing the silicon oxide film of the present invention as both the upper protection layer and the lower protection layer, the defect is generated at 300° C. or more, but the defect generating rate is about 2 to 3% even if the defect generating rates at 300° C. and 500° C. are added. In the comparative sample CS8 employing the silicon oxide film 52d of the present invention only as the lower protection layer out of the upper protection layer and the lower protection layer, the defect is generated almost uniformly from 100° C. to 500° C., and the defect generating rate is about 25% in total. In the comparative sample CS9 not employing the silicon oxide film 42d, 42e of the present invention as both the upper protection layer and the lower protection layer, the defect is generated from 100° C. to 500° C. In particular, the defect generating rate at 300° C. and 500° C. are increased, and the defect generating rate is about 53% in total.

(x) Examination of the barrier characteristic to the copper (Cu)

(a) TDDB (Time Dependent Dielectric Breakdown) test

The TDDB test measures a time required to come up to the dielectric breakdown when the voltage is applied to the sample.

The examined sample is prepared by stacking the PE-CVD TMS $SiO_2$ film according to the present invention and the Cu film on the Si substrate in sequence. By way of comparison, the similar examination is applied to the sample employing the PE-CVD TEOS $SiO_2$ film in place of the PE-CVD TMS $SiO_2$ film, and the sample interposing the TiN film between the Cu film and the PE-CVD TEOS $SiO_2$ film.

According to the examined results, the breakdown lifetime of $10\times10^5$ seconds is obtained at the electric field strength of 8 MV/cm.

In contrast, in the sample employing the PE-CVD TEOS $SiO_2$ film, the electric field strength is 8 MV/cm to get the breakdown lifetime on the order of $10\times10^5$ seconds. This means that the breakdown lifetime of the sample employing the PE-CVD TMS $SiO_2$ film is longer by almost six figures than the sample employing the PE-CVD TEOS $SiO_2$ film.

In the sample interposing the TiN film between the Cu film and the PE-CVD TEOS $SiO_2$ film, the electric field strength is 7.5 MV/cm to get the breakdown lifetime on the order of $10\times10^5$ seconds.

With the above, it is possible to say that the sample employing the PE-CVD TMS $SiO_2$ film has the longer breakdown lifetime by almost six figures than the sample employing the PE-CVD TEOS $SiO_2$ film and has the barrier characteristic to Cu, that is equivalent to or more than the TiN film.

(b) Examination of heat resistance

Figure 10:
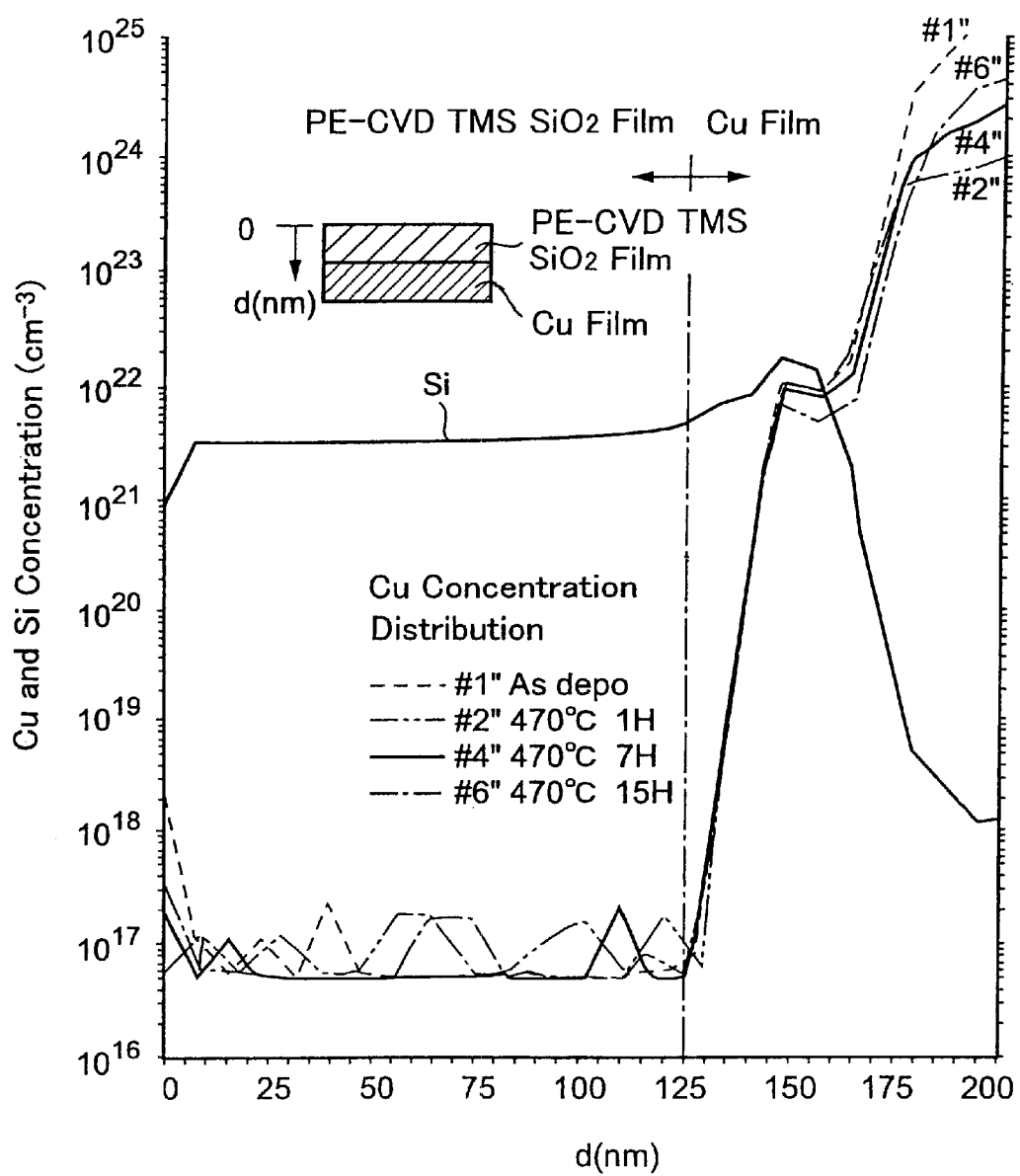
FIG. 10 is a graph showing examined results of a barrier characteristic to a copper of the silicon-containing insulating film that is formed by the film forming method according to the second embodiment of the present invention.

As shown in FIG. 10, the examined sample is prepared by stacking the PE-CVD TMS $SiO_2$ film of 125 nm thickness according to the present invention and the Cu film on the Si substrate (not shown) to contact to each other.

The examination is made by measuring the Cu concentration distribution state in the PE-CVD TMS $SiO_2$ film on the basis of the state obtained immediately after the film formation (indicated by a dotted line in FIG. 10) after the sample is processed for a predetermined time (three types, i.e., 1 hour (chain double-dashed line), 7 hours (solid line), and 15 hours (dot-dash line)) at the temperature of 470° C.

FIG. 10 is a graph showing the examined results. In FIG. 10, an ordinate on the left side denotes a Cu concentration and a Si concentration ($cm^{-3}$) represented in a logarithmic scale. An abscissa denotes a depth (nm) measured from one surface of the PE-CVD TMS $SiO_2$ film toward the Cu film side and represented in a linear scale.

As shown in FIG. 10, the distribution is seldom changed from the distribution obtained immediately after the film formation. In other words, it is found that the PE-CVD TMS $SiO_2$ film has the sufficient barrier characteristic to the Cu.

In the above, the alkoxy compound (ex. TMS) having Si—H bonds is employed as the silicon-containing gas in the film forming gas. But the siloxane having Si—H bonds may be employed.

Also, $N_2O$ is employed as the oxygen-containing gas in the above. But any one selected from the group consisting of oxygen ($O_2$), nitrogen dioxide ($NO_2$), carbon monoxide (CO), carbon dioxide ($CO_2$) and water ($H_2O$) may be employed.

In addition, if any one selected from the group consisting of hydrogen ($H_2$) and nitrogen ($N_2$) is added to the above film forming gas, the density can be further enhanced.

(Third Embodiment)

Next, a semiconductor device and a method of manufacturing the same according to a third embodiment of the present invention will be explained with reference to FIGS. 11A to 11E hereunder.

Figure 11A:
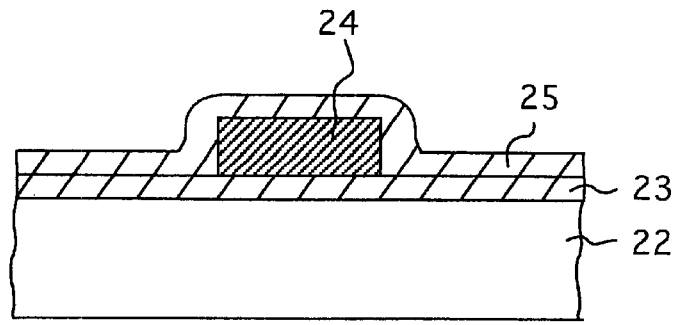
FIGS. 11A and 11E are sectional views showing a semiconductor device manufacturing method according to a third embodiment of the present invention.
Figure 11B:
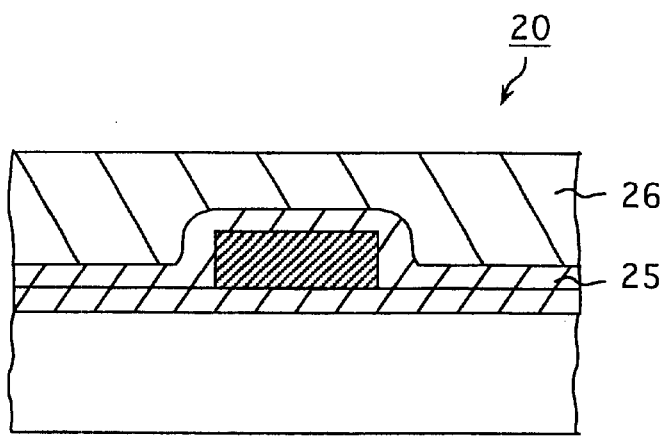
Figure 11C:
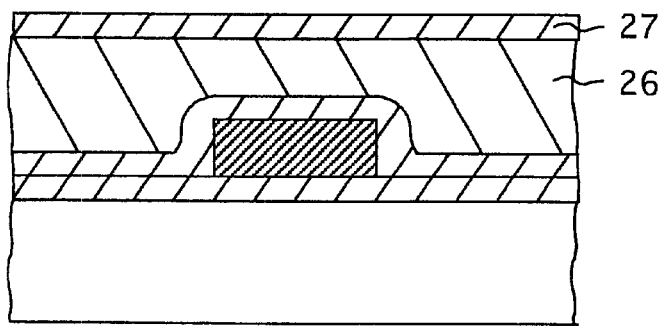
Figure 11D:
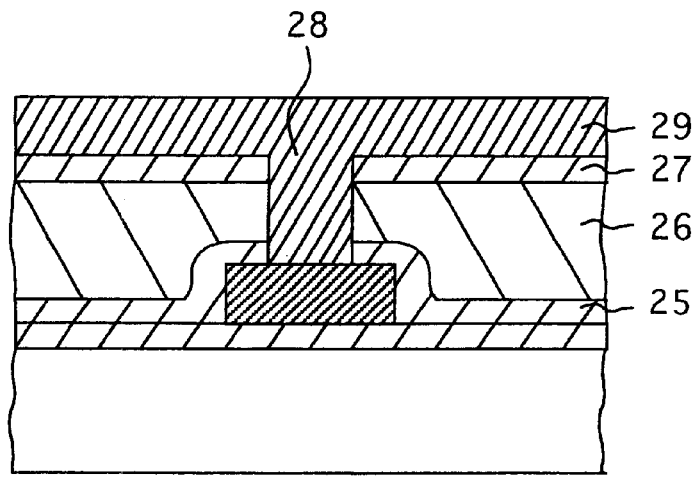
Figure 11E:
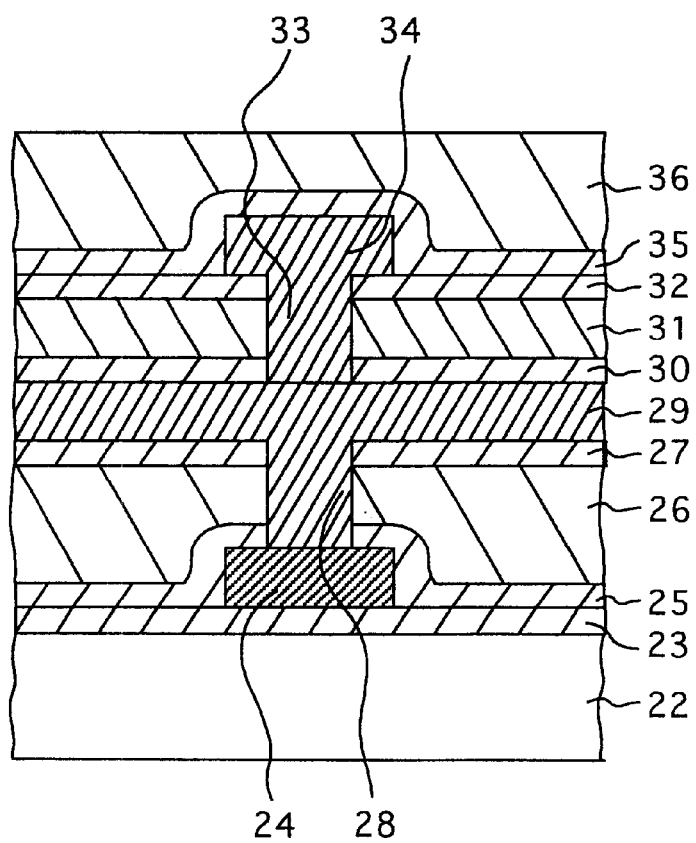

FIG. 11E are sectional views showing the semiconductor device according to the third embodiment of the present invention.

A base protection layer 23 consisting of a silicon-containing insulating film according to the present invention is formed on a base substrate 22. Three-layered wirings 24, 29, 34 which interpose an interlayer insulating film between any two adjacent wirings are formed on the base protection layer 23. These interlayer insulating films are constructed by a lower protection layer 25, 30, a main insulating film 26, 31, and an upper protection layer 27, 32. The lower protection layer 25, 30 and upper protection layer 27, 32 are made of the silicon-containing insulating film according to the present invention. A protection layer 35 made of the silicon-containing insulating film according to the present invention and a coating insulating film 36 are formed on the uppermost wiring 34.

The silicon-containing insulating film according to the present invention, which constitutes the protection layer 23, 25, 27, 30, 32, 35, has a peak of the absorption intensity of the infrared rays in a range of the wave number 2270 to 2350 $cm^{-1}$, a film density in a range of 2.25 to 2.40 $g/cm^3$, and a relative dielectric constant in a range of 3.3 to 4.3.

A silicon substrate or a base substrate in which a wiring or an insulating film is formed on a silicon substrate is employed as the base substrate 22.

According to the experiment carried out by the inventor of the present application, the silicon-containing insulating film 23, 25, 27, 30, 32, 35 having aforementioned characteristics has a high mechanical strength, is dense, is excellent in the water resistance, is little in a moisture content in the film similar to the silicon nitride film, and is lower in the relative dielectric constant in contrast to the silicon nitride film. Further, the silicon-containing insulating film 23, 25, 27, 30, 32, 35 has a good adhesiveness with the coating insulating film.

Accordingly, an employment of the silicon-containing insulating film having aforementioned characteristics as the protection layer 23, 25, 27, 30, 32, 35 for covering the wiring 24, 29, 34, etc, contributes to a prevention of a corrosion of the wirings 24, 29, 34 through blocking a penetration of incoming water as well as a reduction of a parasitic capacitance between the wirings 24, 29, 34.

Moreover, an employment of the silicon-containing insulating film having aforementioned characteristics as the protection layer 23, 25, 27, 30, 32, 35 for protecting an upper and a lower surfaces of the coating insulating film 26, 31, 36 contributes to a prevention of a corrosion of the wirings 24, 29, 34 through blocking a flowing-out of moisture to outer periphery of the protection layer 23, 25, 27, 30, 32, 35 and a penetration of incoming water as well as a reduction of a parasitic capacitance between the wirings 24, 29, 34.

Further, since the silicon-containing insulating film having aforementioned characteristics has a good adhesiveness to the coating insulating film 26, 31, 36 and a high mechanical strength, the laminated structure is prevented from a destroy such as a peeling-off of the films, etc., even if a mechanical shock is applied to the laminated structure from outside.

FIGS. 11A to 11E are sectional views showing the method of manufacturing the semiconductor device according to the third embodiment of the present invention. TMS+$N_2O$ is employed as the film forming gas for the base protection layer, the lower protection layer, the upper protection layer, and the protection layer, which are formed on at least any surface of the upper and lower surfaces of the coating insulating film and to which the present invention is applied.

First, as shown in FIG. 11A, a base insulating film 23 made of the PE-CVD TMS $SiO_2$ film is formed on the silicon substrate (base substrate) 22 by the plasma CVD method using TMS+$N_2O$ as the film forming gas.

In order to form the PE-CVD TMS $SiO_2$ film (base protection layer) 23, first the silicon substrate 22 is loaded into the chamber 1 of the plasma film forming apparatus 101 shown in FIG. 1 and then held by the substrate holder 3. Then, the silicon substrate 22 is heated to be held at the temperature of 350° C. TMS and $N_2O$ gas are introduced into the chamber 1 of the plasma film forming apparatus 101 at flow rates of 100 sccm and 3000 sccm respectively to hold the pressure at 0.7 Torr. Then, the power 0.3 $W/cm^2$ having the frequency of 380 kHz is applied to the lower electrode 3 and also the power 0.3 $W/cm^2$ having the frequency of 13.56 MHz is applied to the upper electrode 2.

Accordingly, TMS and $N_2O$ are plasmanized. The PE-CVD TMS $SiO_2$ film 23 of about 200 nm thickness is formed while holding this condition for a predetermined time. According to the examination, the formed PE-CVD TMS $SiO_2$ film 23 has the relative dielectric constant of about 3.9 that is measured at the frequency of 1 MHz, and the leakage current of $10^{-8}$ $A/cm^2$ at the electric field strength of 5 MV/cm.

Then, a first wiring 24 is formed on the base protection layer 23. Then, a first barrier insulating film (a lower protection layer) 25 made of the PE-CVD TMS $SiO_2$ film having the thickness of about 500 nm is formed thereon by the plasma CVD method that is set to the same film forming conditions used when the above PE-CVD TMS $SiO_2$ film 23 is formed.

The formed first barrier insulating film 25 has the relative dielectric constant of about 3.9 that is measured at the frequency of 1 MHz, and the leakage current of $10^{-8}$ $A/cm^2$ at the electric field strength of 5 MV/cm.

In this case, if the first wiring 24 is formed of the copper wiring, a TaN film serving as the copper barrier to the base protection layer 23 and a Cu film formed by the sputter, although not shown, are formed between the base protection layer 23 and the first wiring 24 from the bottom.

Then, as shown in FIG. 11B, a first coating insulating film 26 having the low relative dielectric constant and the film thickness of about 500 to 1000 nm is formed by the spin coating method employing the coating liquid containing the silicon-containing inorganic compound or the silicon-containing organic compound. The first coating insulating film 26 constitutes a main insulating film. These elements constitute the substrate 20.

Where the coating liquid containing the silicon-containing inorganic compound is the coating liquid used to form the inorganic coating insulating film, explained in the above (Formation of Samples) item in the second embodiment, and contains the silicon. Similarly, the coating liquid containing the silicon-containing organic compound is the coating liquid used to form the organic coating insulating film and contains the silicon.

Then, as shown in FIG. 11C, a second barrier insulating film (an upper protection layer) 27 made of the PE-CVD TMS $SiO_2$ film having the thickness of about 50 nm is formed on the first coating insulating film 26 by the plasma CVD method that is set to the seine film forming conditions used for the formation of the above PE-CVD TMS $SiO_2$ film 23.

Then, a photoresist film (not shown) is formed on the second barrier insulating film 27. Then, as shown in FIG. 11D, an opening portion in the photoresist film is formed in the via-hole forming area by patterning the photoresist film. Then, first the second barrier insulating film 27 is etched and removed via the opening portion in the photoresist film by the reactive ion etching (RIE) using the plasmanized $CF_4$+$CHF_3$-based mixed gas. Then, the first coating insulating film 26 is etched and removed by using the $CF_4$+$CHF_3$-based mixed gas, whose composition ratio is changed from the gas used in the etching of the second barrier insulating film 27. Accordingly, an opening portion is formed to expose the first barrier insulating film 25 at the bottom of the opening portion. A concentration of the $CF_4$+$CHF_3$-based mixed gas may be adjusted by adding Ar+$O_2$, etc. in addition to $CF_4$+$CHF_3$.

After this, the ashing of the photoresist film is carried out.

Then, the first barrier insulating film 25 is etched and removed via the opening portion in the second barrier insulating film 27 and the opening portion in the first coating insulating film 26 by the reactive ion etching (RIE) using the plasmanized $CF_4$+$CHF_3$-based mixed gas, that has the same composition ratio as the gas used in the etching of the above second barrier insulating film 27. Accordingly, a first via hole is formed to expose the first wiring 24 from its bottom portion. At this time, the first wiring 24 has the etching resistance against the etching gas for the above barrier insulating film 25. As a result, the first wiring 24 is not badly affected by the etching gas. In this case, if a surface of the first wiring 24 is oxidized, an oxide film may be removed by exposing to the hydrogen plasma diluted with a reducing gas, for example, $NH_3$, an inert gas such as argon, nitrogen, or the like after the ashing step of the photoresist film and the etching step of the first barrier insulating film 25 are completed.

Then, the photoresist film is removed, and then a conductive film is filled in the first via hole 28. Then, a second wiring 29 made of copper or aluminum is formed to be connected to the first wiring 24 via the conductive film. In this case, if the second wiring 29 is made mainly of copper, an underlying conductive film consisting of a barrier metal film such as tantalum nitride (TaN), etc. and a copper film formed by the sputter method is provided in the via hole 28 and on the second barrier insulating film 27, and then a conductive film made of copper is deposited thereon.

Then, a third barrier insulating film (a lower protection layer) 30 made of the PE-CVD TMS $SiO_2$ film having the film thickness of about 50 nm; a second coating insulating film 31 having the low dielectric constant and the film thickness of about 500 to 1000 nm, that is formed on the third barrier insulating film 30 by the same material and conditions as the coating method in FIG. 11B; and a fourth barrier insulating film (an upper protection layer) 32 made of the PE-CVD TMS $SiO_2$ film having the film thickness of about 50 nm are formed in sequence by repeating the steps shown in FIGS. 11A to 11D. Then, a second via hole 33 is formed to pierce the fourth barrier insulating film 32, the second coating insulating film 31, and the third barrier insulating film 30. Then, a third wiring 34 that is connected to the second wiring 29 via the second via hole 33 is formed on the fourth barrier insulating film 32.

Then, a fifth barrier insulating film (a lower protection layer) 35 made of the PE-CVD TMS $SiO_2$ film having the film thickness of about 50 nm is formed by the plasma CVD method of the present invention to cover the third wiring 34. Then, a third coating insulating film 36 having the low dielectric constant and the film thickness of about 500 to 1000 nm is formed on the fifth barrier insulating film 35 by the same material and conditions as the coating method in FIG. 11B.

With the above, the formation of the second wiring 29 that is connected to the first wiring 24 and the third wiring 34 that is connected to the second wiring 29 is completed.

According to the third embodiment, the upper and lower surfaces of the first coating insulating film 26 having the low dielectric constant are covered with the first barrier insulating film 25 made of the PE-CVD TMS $SiO_2$ film and the second barrier insulating film 27 made of the PE-CVD TMS $SiO_2$ film. Similarly, the upper and lower surfaces of the second coating insulating film 31 having the low dielectric constant are covered with the third barrier insulating film 30 made of the PE-CVD TMS $SiO_2$ film and the fourth barrier insulating film 32 made of the PE-CVD TMS $SiO_2$ film.

By the way, as indicated by the examined results in the second embodiment, the PE-CVD TMS $SiO_2$ film to which the present invention is applied has the qualities such that such film is dense, is excellent in the water resistance, and has the small amount of contained moisture in the film, that are equivalent to the silicon nitride film.

Accordingly, the entering of the incoming moisture into the first coating insulating film 26 and the second coating insulating film 31 can be blocked. Also, if the moisture is contained originally in the first coating insulating film 26 and the second coating insulating film 31, such moisture can be prevented from flowing out to the peripheral portions of the first coating insulating film 26 and the second coating insulating film 31. Therefore, variation in the relative dielectric constant due to the amount of moisture contained in the first coating insulating film 26 and the second coating insulating film 31 can be suppressed.

Further, the PE-CVD TMS $SiO_2$ film has the equivalent quality to the silicon nitride film in the respect of density, but has the quality of the small relative dielectric constant, that is largely different from the silicon nitride film. As a result, if the PE-CVD TMS $SiO_2$ film is employed as the interlayer insulating film, the smaller relative dielectric constant of the interlayer insulating film can be achieved.

In particular, if the PE-CVD TMS $SiO_2$ film is employed as the first barrier insulating film 25 and the second barrier insulating film 27 that protect the lower and upper surfaces of the first coating insulating film 26 respectively, the smaller relative dielectric constant can be achieved as the overall first interlayer insulating film that is constructed by these films. Similarly, the PE-CVD TMS $SiO_2$ film is employed as the third barrier insulating film 30 and the fourth barrier insulating film 32 that protect the lower and upper surfaces of the second coating insulating film 31, the smaller relative dielectric constant can be achieved as the overall second interlayer insulating film that is constructed by these films.

Moreover, the peripheral portions of the first wiring 24, the second wiring 29, and the third wiring 34 are wrapped by the base insulating film 23 and the first barrier insulating film 25, the second barrier insulating film 27 and the third barrier insulating film 30, and the fourth barrier insulating film 32 and the fifth barrier insulating film 35 respectively. Therefore, the corrosion of the first wiring 24, the second wiring 29, and the third wiring 34 can be prevented by blocking the enter of the incoming moisture.

Particularly, since the base insulating film 23 is also formed of the PE-CVD TMS $SiO_2$ film to which the present invention is applied, all peripheral portions of the first wiring 24 are protected by the PE-CVD TMS $SiO_2$ film. Therefore, the corrosion of the first wiring 24 can be prevented more completely by blocking the permeation of the moisture from all peripheral portions.

In the above third embodiment, the PE-CVD TMS $SiO_2$ film formed by the plasma enhanced CVD method according to the present invention is employed as the base protection layer 23. However, a thermal oxide film formed by oxidizing the silicon substrate 22 by heating it in the oxygen-containing atmosphere may be employed as the base insulating film 23. Further, an NSG film or a BPSG (BoroPhosphoSilicate Glass) film, etc. which is formed by the CVD method using the organic silicon-containing gas may be employed as the base insulating film 23.

(Fourth Embodiment)

Next, a semiconductor device and a method of manufacturing the same according to a (fourth embodiment of the present invention will be explained with reference to FIGS. 12A to 12D hereunder.

Figure 12A:
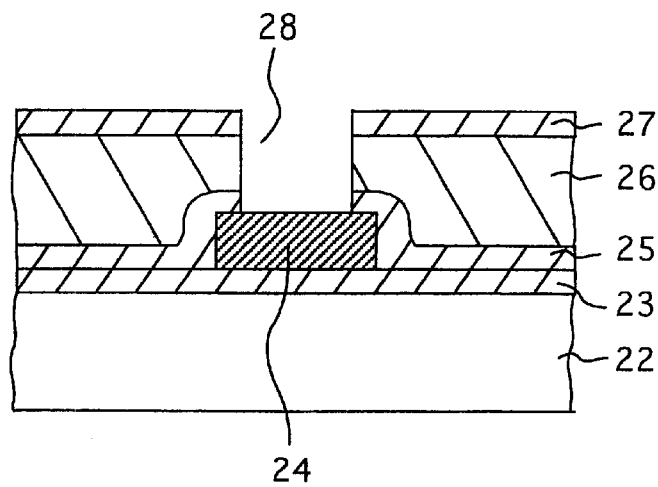
FIGS. 12A to 12D are sectional views showing a semiconductor device manufacturing method according to a fourth embodiment of the present invention.
Figure 12B:
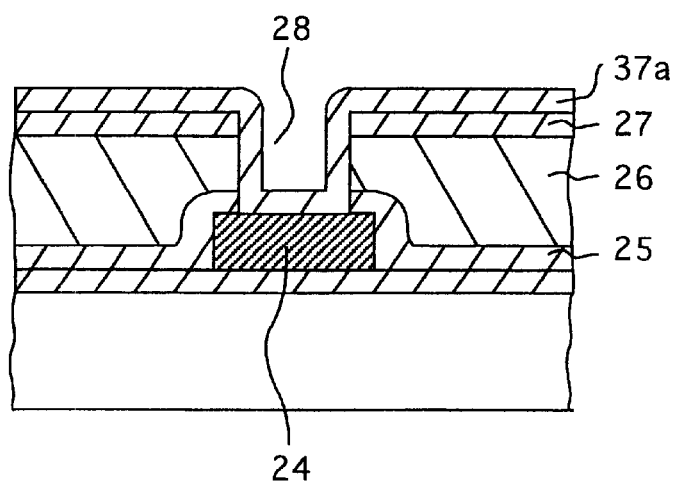
Figure 12C:
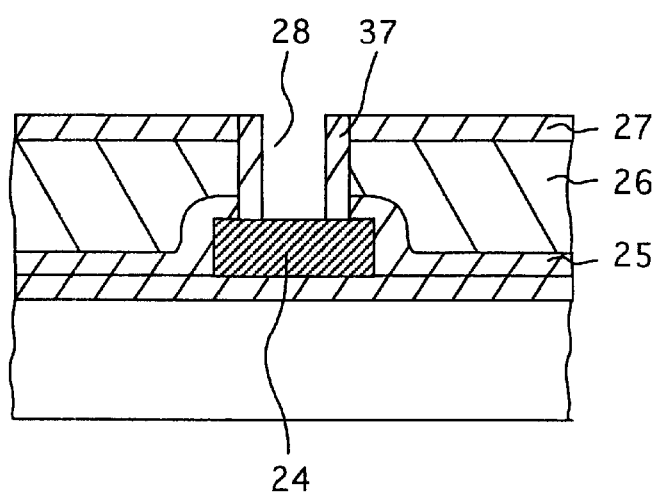
Figure 12D:
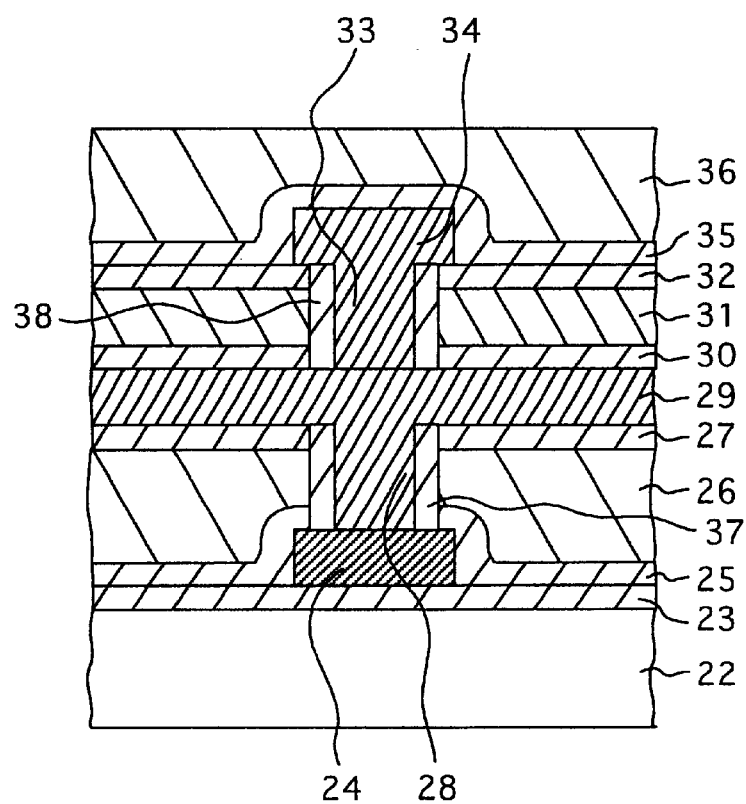

FIGS. 12D is a sectional view showing a semiconductor device according to a fourth embodiment of the present invention.

A difference from the third embodiment resides in that sidewalls in the first via hole 28 and the second via hole 33 are covered with the PE-CVD TMS $SiO_2$ films 37, 38 to which the present invention is applied and thus the first coating insulating film 26 and the second coating insulating film 31 are not exposed in the first via hole 28 and the second via hole 33.

Next, the method for implementing the above structure is explained. FIGS. 12A to 12D are sectional views showing a method of manufacturing the semiconductor device according to a fourth embodiment of the present invention. TMS+ $N_2O$ is used as the film forming gas applied to the formation of a sidewall protection layer other than the lower and upper protection layers, to which the present invention is applied.

In order to implement the above structure, as shown in FIG. 12A, the first via hole 28 is formed after the step shown in FIG. 11C. Then, as shown in FIG. 12B, the PE-CVD TMS $SiO_2$ film 37a having the film thickness of about 50 nm, to which the present invention is applied, is formed on the second barrier insulating film 27 so as to cover the first via hole 28. Then, as shown in FIG. 12C, the PE-CVD TMS $SiO_2$ film 37a is etched by the anisotropic etching to leave the PE-CVD TMS $SiO_2$ film (a sidewall protection layer) 37 on the sidewall of the first via hole 28.

Then, as shown in FIG. 12D, the second wiring 29 made of copper or aluminum is formed to be connected to the first wiring 24 via the conductive film. Then, the interlayer insulating film consisting of the second coating insulating film 31 and the third and fourth barrier insulating films 30, 32, that are formed to cover a lower and an upper surfaces of the second coating insulating film 31 and to have the film thickness of about 50 nm; the second via hole 33 to pierce the interlayer insulating film; a sixth barrier insulating film 38 made of the PE-CVD TMS $SiO_2$ film having the film thickness of about 50 nm to cover the sidewall of the second via hole 33; the third wiring 34 connected to the second wiring 29 via the second via hole 33; the fifth barrier insulating film 35 made of the PE-CVD TMS $SiO_2$ film having the film thickness of about 50 nm to cover the third wiring 34; and the third coating insulating film 36 are formed by repeating the above steps.

According to the fourth embodiment, the first coating insulating film 26 and the second coating insulating film 31 including the insides of the first via hole 28 and the second via hole 33 are completely protected by the PE-CVD TMS $SiO_2$ films 25, 27, 37 and 30, 23, 38. Therefore, both the entering of the moisture into the first coating insulating film 26 and the second coating insulating film 31 and the flowing-out of the moisture from the first coating insulating film 26 and the second coating insulating film 31 to the peripheral portions can be blocked more completely.

As a result, the time dependent change in the relative dielectric constant of the interlayer insulating film and the corrosion of the upper and lower wirings 24, 29, 34 under and on the interlayer insulating film can be prevented.

(Fifth Embodiment)

Figure 13:
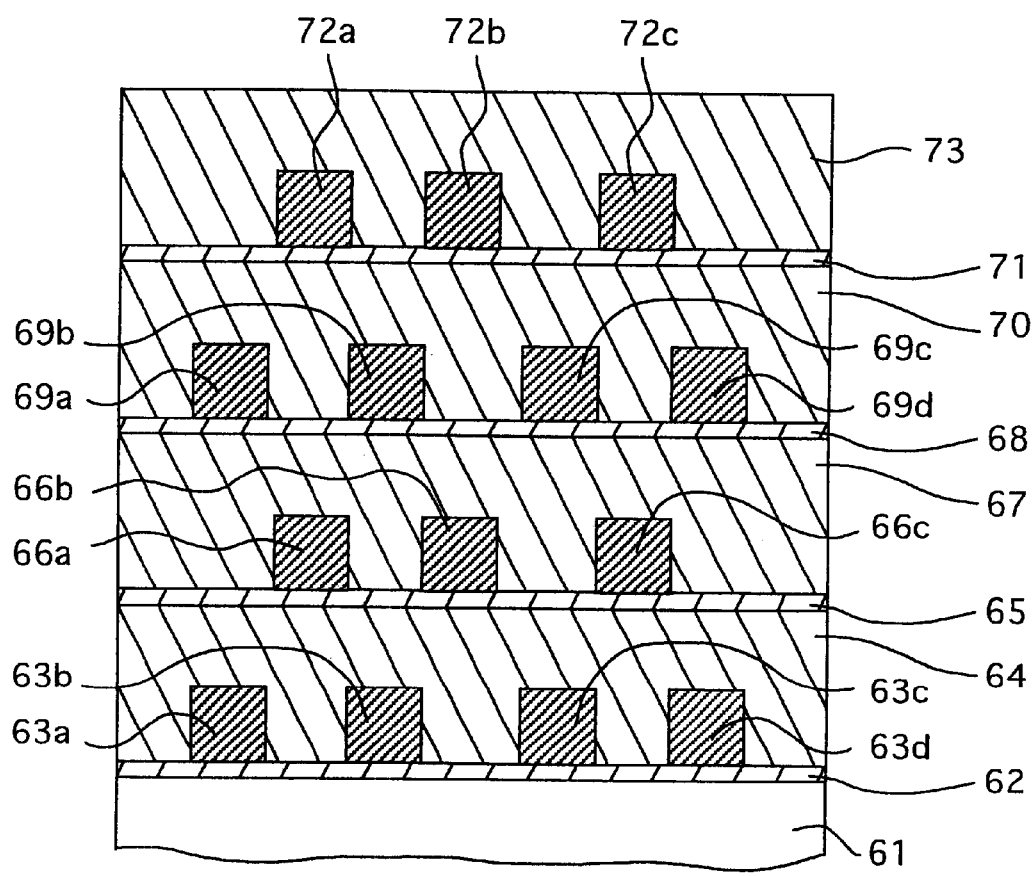
FIG. 13 is a sectional view showing a semiconductor device manufacturing method according to a fifth embodiment of the present invention.

FIG. 13 is a sectional view showing a semiconductor device and a method of manufacturing the same according to a fifth embodiment of the present invention.

This semiconductor device has a configuration in which four sets of laminated structures are laminated. The laminated structure of one set comprises a set of a protection layer, a wiring group on the protection layer and an interlayer insulating film or a cover insulating film covering a wiring group.

In other words, this semiconductor device has a first wiring group of wirings 63a to 63d, a second wiring group of wirings 66a to 66c, a third wiring group of wirings 69a to 69d, and a fourth wiring group of wirings 72a to 72d on first to fourth protection layers 62, 65, 68, 71 made of the PE-CVD $SiO_2$ film according to the present invention, respectively. The symbols indicating the wiring groups are occasionally omitted in the following description in order to simplify the explanation.

The respective wiring groups are covered with interlayer insulating films 64, 67, 70 made of a coating insulating film and a cover insulating film 73 made of a coating insulating film in order from the bottom first wiring group of wirings 63a to 63d.

The PE-CVD $SiO_2$ film constituting each of the first to fourth protection layers 62, 65, 68, 71 has a peak of the absorption intensity of the infrared rays in a range of the wave number 2270 to 2350 $cm^{-1}$, a film density in a range of 2.25 to 2.40 $g/cm^3$, and a relative dielectric constant in a range of 3.3 to 4.3.

As described above, according to the fifth embodiment, the protection layers 65, 68, 71 according to the present invention are put between any adjacent two wiring groups.

The protection layers 65, 68, 71 themselves are dense, and are excellent in the water resistance. From the characteristics, they have a function of blocking a penetration of incoming moisture and a pass of leakage current. Accordingly, the semiconductor device according to a fifth embodiment can prevent the wirings from corrosion, and can suppress leakage current between the wiring groups.

Further, the protection layers 65, 68, 71 are formed to contact the interlayer insulating film 64, 67, 70 and the cover insulating film 73. Since the PE-CVD $SiO_2$ film constituting each of the protection layers 62, 65, 68, 71 has a good adhesiveness to the coating insulating film constituting each of the interlayer insulating film 64, 67, 70 and the cover insulating film 73, the semiconductor device according to a fifth embodiment can prevent the films from peeling-off.

Further, since the coating insulating films are employed as the interlayer insulating film 64, 67, 70 and the cover insulating film 73, the interlayer insulating film 64, 67, 70 and the cover insulating film 73 which are excellent in flatness can be obtained.

The manufacturing method will be explained hereunder.

As shown in FIG. 13, first the first protection layer (the first barrier insulating film) 62 made of the PE-CVD TMS $SiO_2$ film having the film thickness of 200 nm, to which the present invention is applied, is formed on the substrate 61. In this case, the semiconductor substrate itself or the structure obtained by forming the base insulating film and the wiring on the semiconductor substrate may be employed as the substrate 61.

Then, the first wiring group of wirings 63a to 63d are formed on the first protection layer 62. Then, the first coating insulating film 64 is formed by covering the first wiring group of wirings 63a to 63d with the same material as the third and fourth embodiments and by employing the same film forming method as them.

Then, the second protection layer (the second barrier insulating film) 65 made of the second PE-CVD TMS $SiO_2$ film having a film thickness of about 50 nm, to which the present invention is applied, is formed on the first coating insulating film 64. Then, the second wiring group of second wirings 66a to 66c are formed on the second protection layer 65. Then, the second coating insulating film 67 is formed by covering the second wiring group of wirings 66a to 66c with the same material as the third and fourth embodiments and by employing the same film forming method as them.

Then, the third protection layer (the third barrier insulating film) 68 having a film thickness of about 50 nm and made of the PE-CVD TMS $SiO_2$ film; the third wiring group of wirings 69a to 69d; the third coating insulating film 70; the fourth protection layer (the fourth barrier insulating film) 71 having a film thickness of about 50 nm and made of the PE-CVD TMS $SiO_2$ film; the fourth wiring group of wirings 72a to 72c; and the fourth coating insulating film 73 are formed in sequence on the second coating insulating film 67, by repeating twice sequentially the step of forming the above PE-CVD TMS $SiO_2$ film, the step of forming the wiring, and the step of forming the coating insulating film.

Accordingly, there can be formed a semiconductor integrated circuit device including the multi-layered, e.g., four-layered in total, wiring groups 63a to 63d, 66a to 66c, 69a to 69d, 72a to 72c, that are insulated and separated by the coating insulating films 64, 67, 70 and the protection layers 65, 68, 71.

As described above, according to the fifth embodiment, the protection layers 65, 68, 71 are interposed between the wiring groups 63a to 63d, 66a to 66c, 69a to 69d, 72a to 72c.

That is, since the coating insulating films 64, 67, 70 are employed as the main interlayer insulating film, the interlayer insulating film that is excellent in the flatness can be obtained.

Also, the protection layers 65, 68, 71 per se are dense and have the water resistance, they have functions of preventing the permeation of the incoming moisture and preventing the flow of the leakage current. Therefore, the corrosion of the wiring groups 63a to 63d, 66a to 66c, 69a to 69d, 72a to 72c due to the incoming moisture can be prevented, and also the leakage current between the wiring groups 63a to 63d, 66a to 66c, 69a to 69d, 72a to 72c can be suppressed.

With the above, the present invention is explained in detail based on the embodiments, but the scope of the present invention is not limited to examples given concretely in the above embodiments. Variations of the above embodiments may be contained in the scope of the present invention without departing from the gist of the present invention.

As described above, according to the present invention, after the coating insulating film is formed on the substrate, the protection layer made of the silicon-containing insulating film for covering the coating insulating film is formed by plasmanizing the film forming gas, that consists of the alkoxy compound having Si—H bonds or the siloxane having Si—H bonds and any one oxygen-containing gas out of $O_2$, $N_2O$, $NO_2$, CO, $CO_2$, and $H_2O$, to react.

The silicon-containing insulating film of the present invention constituting the protection layer has a peak of the absorption intensity of the infrared rays in a range of the wave number 2270 to 2350 $cm^{-3}$, a film density in a range of 2.25 to 2.40 $g/cm^3$, and a relative dielectric constant in a range of 3.3 to 4.3.

The protection layer formed in this manner to have the above characteristics has the good adhesiveness to the coating insulating film, is dense to the same extent as the silicon nitride film, is excellent in the water resistance, and contains the small amount of contained moisture in the film. Therefore, if the coating insulating film and the protection layer for coating the coating insulating film are formed, there can be obtained the interlayer insulating film that can have the more complete barrier characteristic to the entering of the moisture into the coating insulating film from the outside and the flowing-out of the moisture to the outside, and is excellent in flatness.

Also, the above protection layer has the smaller relative dielectric constant than the silicon nitride film in addition to the above characteristics. Therefore, if the barrier insulating film according to the present invention are formed to cover the lower and upper surfaces of the coating insulating film serving as the main interlayer insulating film between the wiring layers, there can be obtained the interlayer insulating film that has more completely the barrier characteristic to the entering/flowing-out of the moisture into/from the coating insulating film, the barrier characteristic to the leakage current, etc. and also achieves the low dielectric constant as a whole.

The silicon-containing insulating film having aforementioned characteristics has a good adhesiveness with the coating insulating film, and has the high mechanical strength. Therefore, the laminated structure can be prevented from a destroy such as a peeling-off of the films, etc., even if a mechanical shock is applied to the laminated structure from outside.

What is claimed is:

1. A semiconductor device comprising:
   (i) a substrate having, on at least one surface, a coating of an insulating film containing at least one silicon compound selected from the group consisting of silicon-containing organic compounds and silicon-containing inorganic compounds; and
   (ii) a first protection layer covering and in contact with the insulating film, wherein the first protection layer covering the insulating film is a silicon-containing insulating film which has a peak absorption intensity of infrared rays in a range of a wave number 2270 to 2350 cm$^{-1}$, a film density in a range of 2.25 to 2.40 g/cm$^3$, and a relative dielectric constant in a range of 3.3 to 4.3.

2. A semiconductor device according to claim 1, further comprising first wiring and a second protection layer covering and in contact with the first wiring, on said one surface of the substrate, wherein the second protection layer covering the first wiring is a silicon-containing insulating film which has a peak absorption intensity of infrared rays in a range of a wave number 2270 to 2350 cm$^{-1}$, a film density in a range of 2.25 to 2.40 g/cm$^3$, and a relative dielectric constant in a range of 3.3 to 4.3.

3. A semiconductor device according to claim 2, further comprising second wiring on an interlayer insulating film which consists of the second protection layer covering the first wiring, a second insulating film formed on the second protection layer, and a third protection layer covering the second insulating film.

4. A semiconductor device according to claims 3, further comprising an opening formed in the interlayer insulating film and a sidewall protection layer on a sidewall of the opening, wherein the second wiring contacts the first wiring through the opening, and the sidewall protection layer is a silicon-containing insulating film which has a peak absorption intensity of infrared rays in a range of a wave number 2270 to 2350 cm$^{-1}$, a film density in a range of 2.25 to 2.40 g/cm$^3$, and a relative dielectric constant in a range of 3.3 to 4.3.

* * * * *

UNITED STATES PATENT AND TRADEMARK OFFICE
CERTIFICATE OF CORRECTION

PATENT NO. : 6,646,327 B2
DATED : November 11, 2003
INVENTOR(S) : Oku et al.

It is certified that error appears in the above-identified patent and that said Letters Patent is hereby corrected as shown below:

<u>Title page,</u>
Item [30], insert the following:

-- Foreign Application Priority Data,
July 21, 2000 (JP) ............................... 2000-221380
Sept. 18, 2000 (JP) ............................... 2000-281263 --

Signed and Sealed this

Tenth Day of August, 2004

JON W. DUDAS
*Acting Director of the United States Patent and Trademark Office*